United States Patent
Verma et al.

(10) Patent No.: US 10,192,886 B2
(45) Date of Patent: Jan. 29, 2019

(54) CREATION OF WIDE BAND GAP MATERIAL FOR INTEGRATION TO SOI THEREOF

(71) Applicant: GLOBALFOUNDRIES Singapore Pte. Ltd., Singapore (SG)

(72) Inventors: Purakh Raj Verma, Singapore (SG); Shaoqiang Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/665,367

(22) Filed: Jul. 31, 2017

(65) Prior Publication Data
US 2017/0358608 A1 Dec. 14, 2017

Related U.S. Application Data

(62) Division of application No. 14/788,703, filed on Jun. 30, 2015, now Pat. No. 9,721,969.

(51) Int. Cl.
*H01L 27/12* (2006.01)
*H01L 29/16* (2006.01)
*H01L 29/20* (2006.01)
*H01L 21/84* (2006.01)
*H01L 21/82* (2006.01)
*H01L 21/8252* (2006.01)

(52) U.S. Cl.
CPC ...... *H01L 27/1207* (2013.01); *H01L 21/8213* (2013.01); *H01L 21/8252* (2013.01); *H01L 21/84* (2013.01); *H01L 29/1608* (2013.01); *H01L 29/20* (2013.01); *H01L 29/2003* (2013.01)

(58) Field of Classification Search
None
See application file for complete search history.

(56) References Cited

U.S. PATENT DOCUMENTS

| | | |
|---|---|---|
| 7,585,748 B2 | 9/2009 | Raskin et al. |
| 8,076,750 B1 | 12/2011 | Kerr et al. |
| 8,492,868 B2 | 7/2013 | Botula et al. |
| 2015/0287642 A1* | 10/2015 | Chang ............ H01L 21/8249 438/236 |

(Continued)

OTHER PUBLICATIONS

L. S. McCarthy et al., AlGaN/GaN Heterojunction Bipolar Transistor, IEEE Electron Device Letters, Jun. 1999, 277-279, vol. 20, No. 6, IEEE.

(Continued)

*Primary Examiner* — Daniel Whalen
(74) *Attorney, Agent, or Firm* — Horizon IP Pte Ltd.

(57) ABSTRACT

Devices and methods for forming a device are presented. The method for forming the device includes providing a support substrate having first crystal orientation. A trap rich layer is formed on the support substrate. An insulator layer is formed over a top surface of the trap rich layer. The method further includes forming a top surface layer having second crystal orientation on the insulator layer. The support substrate, the trap rich layer, the insulator layer and the top surface layer correspond to a substrate and the substrate is defined with at least first and second device regions. A transistor is formed in the top surface layer in the first device region and a wide band gap device is formed in the second device region.

20 Claims, 25 Drawing Sheets

(56) References Cited

U.S. PATENT DOCUMENTS

2015/0318283 A1* 11/2015 Bayram .............. H01L 21/8258
 257/369
2016/0087069 A1* 3/2016 Oda .................. H01L 29/66068
 257/77

OTHER PUBLICATIONS

Umesh K. Mishra et al., AlGaN/GaN HEMTs—An Overview of Device Operation and Applications, Proceedings of the IEEE, Jun. 2002, 1022-1031, vol. 90, No. 6.
Gabriel M. Rebeiz et al., RF MEMS Switches and Switch Circuits, IEEE Microwave Magazine, Dec. 2001, 59-71, Michigan.
D. Qiao et al.,Ta-based interface ohmic contacts to AlGaN/GaN heterostructures, Journal of Applied Physics, May 15, 2001, 5543-5546, vol. 89, No. 10, California.

* cited by examiner

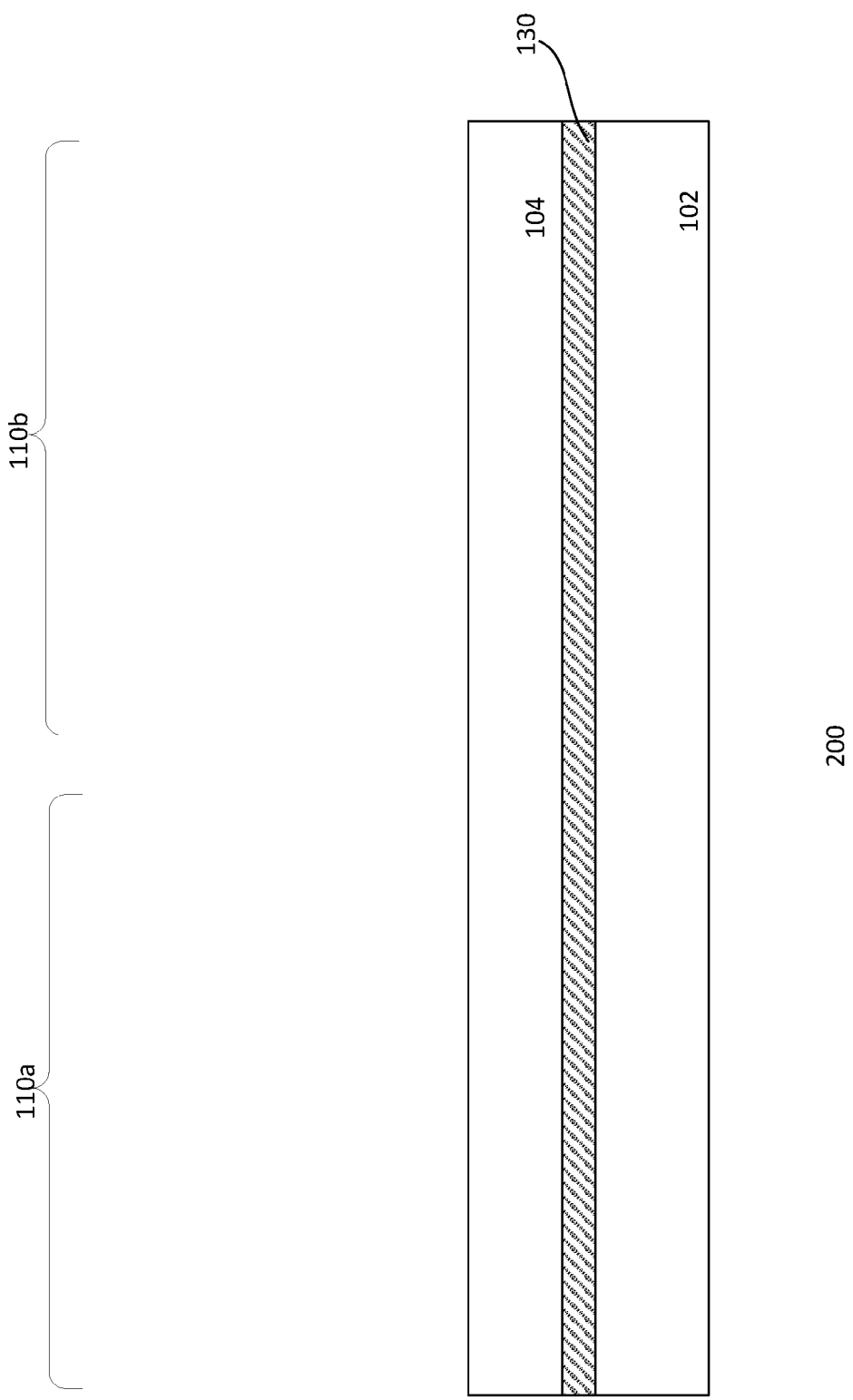

CREATION OF WIDE BAND GAP MATERIAL FOR INTEGRATION TO SOI THEREOF

CROSS-REFERENCE TO RELATED APPLICATION

This application is a divisional application claiming the benefit of co-pending U.S. patent application Ser. No. 14/788,703, filed on Jun. 30, 2015, which is herein incorporated by reference in its entirety for all purposes.

BACKGROUND

As technology advances, there is a desire to integrate power amplifier (PA) and switch to form system-on-chip product for radio frequency (RF) front end applications. Silicon-on-insulator (SOI) Complementary Metal Oxide Semiconductor (CMOS) process is a good platform for Switch products. Power amplifier devices, such as High Electron Mobility Transistor (HEMT) or Hetero-junction Bipolar Transistor (HBT) devices plugged into SOI CMOS process to form PA and Switch system-on-chip product yield a number of advantages. Nevertheless, it is difficult to integrate these devices into SOI Silicon (Si) CMOS processes since HEMT or HBT devices use group III-V compound material, such as AlGaN and GaN. Conventional bulk Si CMOS process has limitations to integrate these devices due to difficulty in achieving good isolation between the devices at high frequency signals.

From the foregoing discussion, it is desirable to provide a reliable, high performing, simplified and cost effective solution for integrating these devices in the same integrated circuit (IC).

SUMMARY

Embodiments generally relate to semiconductor devices and methods for forming a device.

In one embodiment, a method for forming a semiconductor device is disclosed. The method includes providing a support substrate having a first crystal orientation. A trap rich layer is formed on the support substrate. An insulator layer is formed over a top surface of the trap rich layer. The method further includes forming a top surface layer having second crystal orientation on the insulator layer. The support substrate, the trap rich layer, the insulator layer and the top surface layer correspond to a substrate and the substrate is defined with at least first and second device regions. The method also includes forming a transistor in the top surface layer in the first device region and forming a wide band gap device in the second device region.

In another embodiment, a semiconductor device is disclosed. The semiconductor device includes a support substrate having first crystal orientation, a trap rich layer disposed on the support substrate and an insulator layer disposed over a top surface of the trap rich layer. The device further includes a top surface layer having second crystal orientation disposed on the insulator layer. The support substrate, the trap rich layer, the insulator layer and the top surface layer correspond to a substrate and the substrate is defined with at least first and second device regions. The device also includes a transistor disposed in the top surface layer in the first device region and a wide band gap device disposed in the second device region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2k show cross-sectional views of an embodiment of a process for forming a device;

DETAILED DESCRIPTION

Figure 1A:
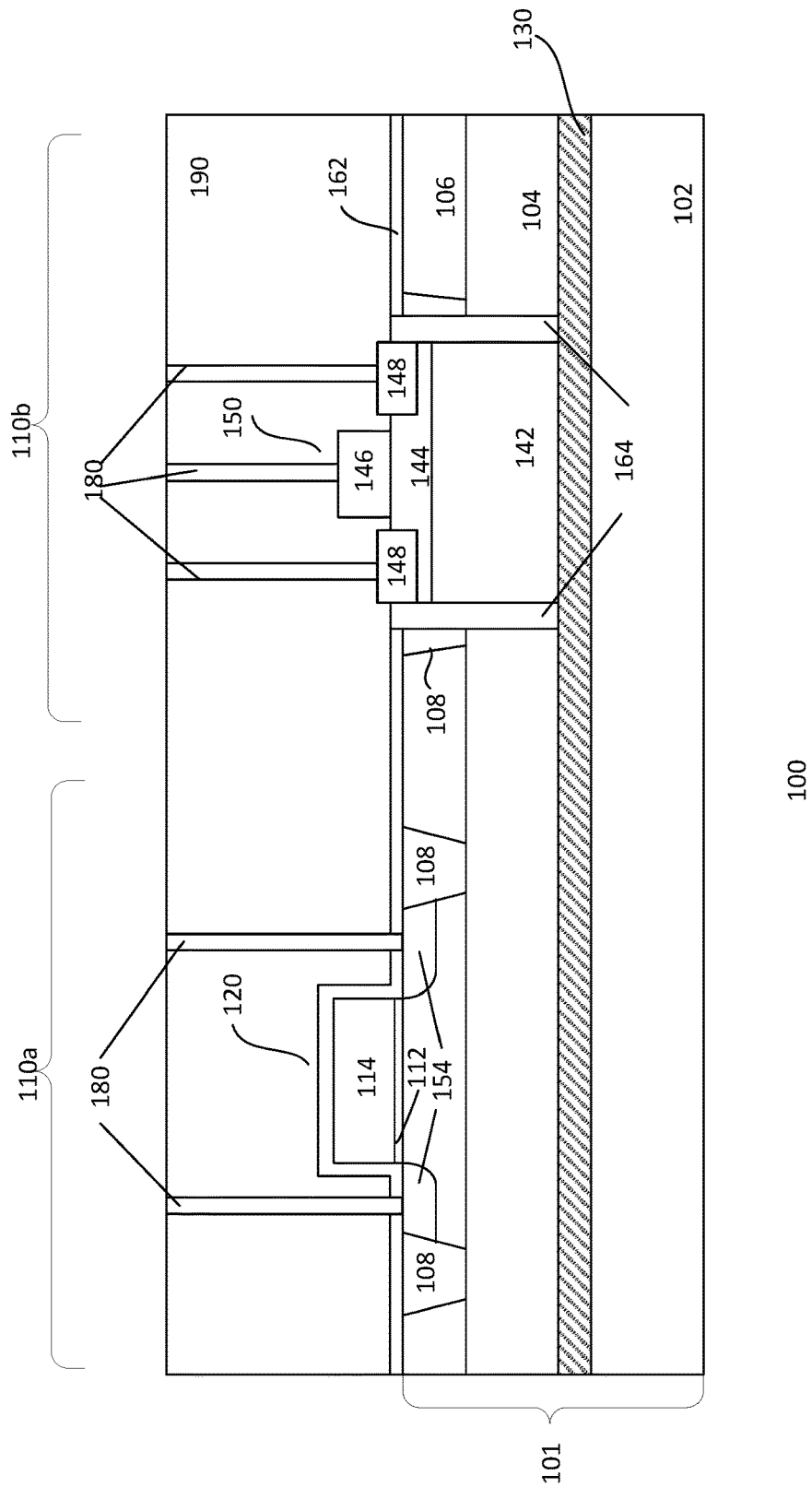
FIGS. 1a-1d show cross-sectional views of various embodiments of a device.

Embodiments generally relate to semiconductor devices or integrated circuits (ICs) having power amplifier device integrated into and compatible with SOI CMOS process. The devices or ICs are suitable for use in radio frequency (RF) front end applications, which can be integrated or used with for example, consumer electronic products or other types of devices.

FIGS. 1a-1d show cross-sectional views of various embodiments of a device 100. The cross-sectional views are along a channel length direction of the device. The device, for example, is an IC. Other types of devices may also be useful. As shown, the device includes a substrate 101. The substrate, for example, includes a support or handle substrate 102, a trap rich layer 130 or 430, an insulator layer 104 and a top surface layer 106.

The support substrate 102, in one embodiment, includes a substrate with first crystal orientation. In one embodiment, the support substrate includes a <111> oriented single crystal substrate. The support substrate, for example, is a <111> silicon (Si) substrate. The support substrate, for example, may be lightly doped with first polarity type dopants, such as p-type dopants to get a high resistivity substrate. Providing a support substrate which is lightly doped with second polarity type dopants, such as n-type dopants, may also be useful. P-type dopants may include boron (B), aluminum (Al), indium (In) or a combination thereof, while n-type dopants may include phosphorus (P), arsenic (As), antimony (Sb) or a combination thereof. Other suitable types of semiconductor substrate with <111> orientation may also be used as the handle substrate.

The trap rich layer 130 or 430 is disposed in between the handle substrate and the insulator layer. The trap rich layer, for example, includes wide band gap material, such as GaN, AlGaN, GaAs, SiC, nanocrystal Si, etc. The trap rich layer, for example, may also include amorphous or polycrystalline Si material with relatively high resistivity, thus inducing sufficient amount of trap center to restrict electron moving. The trap rich layer, for example, may serve to substantially immobilize a surface conduction layer at the surface of the support substrate at RF frequencies.

The insulator layer 104, for example, includes a dielectric insulating material. The insulator layer, for example, is formed from silicon oxide, providing a buried oxide (BOX) layer. Other suitable types of dielectric insulating materials may also be useful.

The top surface layer 106, as shown, includes a semiconductor material. The top surface layer, in one embodiment, includes a semiconductor layer with second crystal orientation. In one embodiment, the top surface layer includes a <100> oriented single crystal layer. The top surface layer, for example, is a <100> Si layer. In this case, the top surface layer may be referred to as the top Si layer and the substrate 101 is a silicon-on-insulator (SOI) substrate. Other suitable types of substrate materials or any other semiconductor materials may also be useful. In one embodiment, the top surface layer and the support substrate include the same material. The top surface layer and the support substrate may also include different materials.

The SOI substrate includes first and second device regions. In one embodiment, the first device region 110a is a first region suitable for CMOS devices. The second device region 110b, in one embodiment, is a second region suitable for wide band gap devices, such as HEMT or HBT devices. Providing other number and types of device regions may also be useful. As can be seen, the first device region 110a includes a transistor 120. The transistor 120, for example, is a metal-oxide-semiconductor field-effect-transistor (MOSFET) having a gate with gate electrode 114 over gate dielectric 112 and source/drain (S/D) regions 154 on either side of the gate. Although only one transistor is shown, it is understood that the first device region may include other number of transistors or devices (not shown).

The first device region 110a is separated from the second device region 110b by isolation regions 108. For example, the isolation region 108 may surround the device region. The isolation regions 108 may be shallow trench isolation (STI) regions. The STI region, for example, extends to the surface of the insulator or BOX layer 104. Providing isolation regions which extend to other depths may also be useful.

Referring to FIGS. 1a-1d, the second device region 110b includes a wide band gap device. In FIG. 1a, device 150 is a HEMT device having active layers 142, 144 and 146. For example, active layer 142 corresponds to a buffer layer, active layer 144 corresponds to a channel layer while active layer 146 serves as a gate for the HEMT device. In the case of a HEMT device, the buffer layer 142, for example, includes suitable group III or group V elements, such as GaN. The buffer layer, for example, serves to overcome thermal expansion and lattice mismatch between the support substrate and the channel layer. The channel layer 144, for example, includes AlGaN or any suitable material which allows for high carrier mobility while the gate 146, for example, includes AlGaN material. Contact regions 148 acting as S/D regions for the HEMT device are disposed adjacent to the gate and in a portion of the channel layer.

As shown, wide band gap device is disposed through an isolation region 108 in the second device region. Protection layers 164 are disposed in the second device region to further isolate the HEMT device from other device regions. The protection layers, for example, include TEOS or SiN. Other suitable types of dielectric material may also be useful. In one embodiment, the active layer 142 is disposed over top surface of the trap rich layer 130 and the protection layers 164 extend from top surface of the top Si layer 106 toward top surface of the trap rich layer 130 as shown in FIG. 1a. Alternatively, the active layer 142 extends through the trap rich layer 430 and is disposed over top surface of the handle substrate 102 while the protection layers 164 extend from top surface of the top Si layer toward top surface of the handle substrate as shown in FIG. 1c. Other suitable configurations of the HEMT device may also be useful.

An etch stop layer 162 may be disposed over the substrate and covers the transistor 120 in the first device region. The etch stop layer, for example, includes a nitride layer. Other suitable etch stop materials may also be useful. A dielectric layer or interlevel dielectric (ILD) layer 190 is disposed on the substrate, covering the devices in the first and second device regions. The dielectric layer, for example, may serve as a pre-metal dielectric (PMD) layer. The dielectric layer 190, for example, may be silicon oxide. Other suitable types of dielectric materials can also be used.

Via contacts or contact plugs 180 are disposed in the dielectric layer 190. The contact plugs, for example, are in communication with S/D regions and gates of the devices. The via contacts, for example, may be formed of tungsten. Via contacts formed of other suitable types of conductive materials, such as copper, aluminum, or conductive alloys, may also be useful. The via contacts, for example, provide electrical connections between the contact regions below and interconnects or other devices (not shown) disposed over the dielectric layer.

Figure 1B:
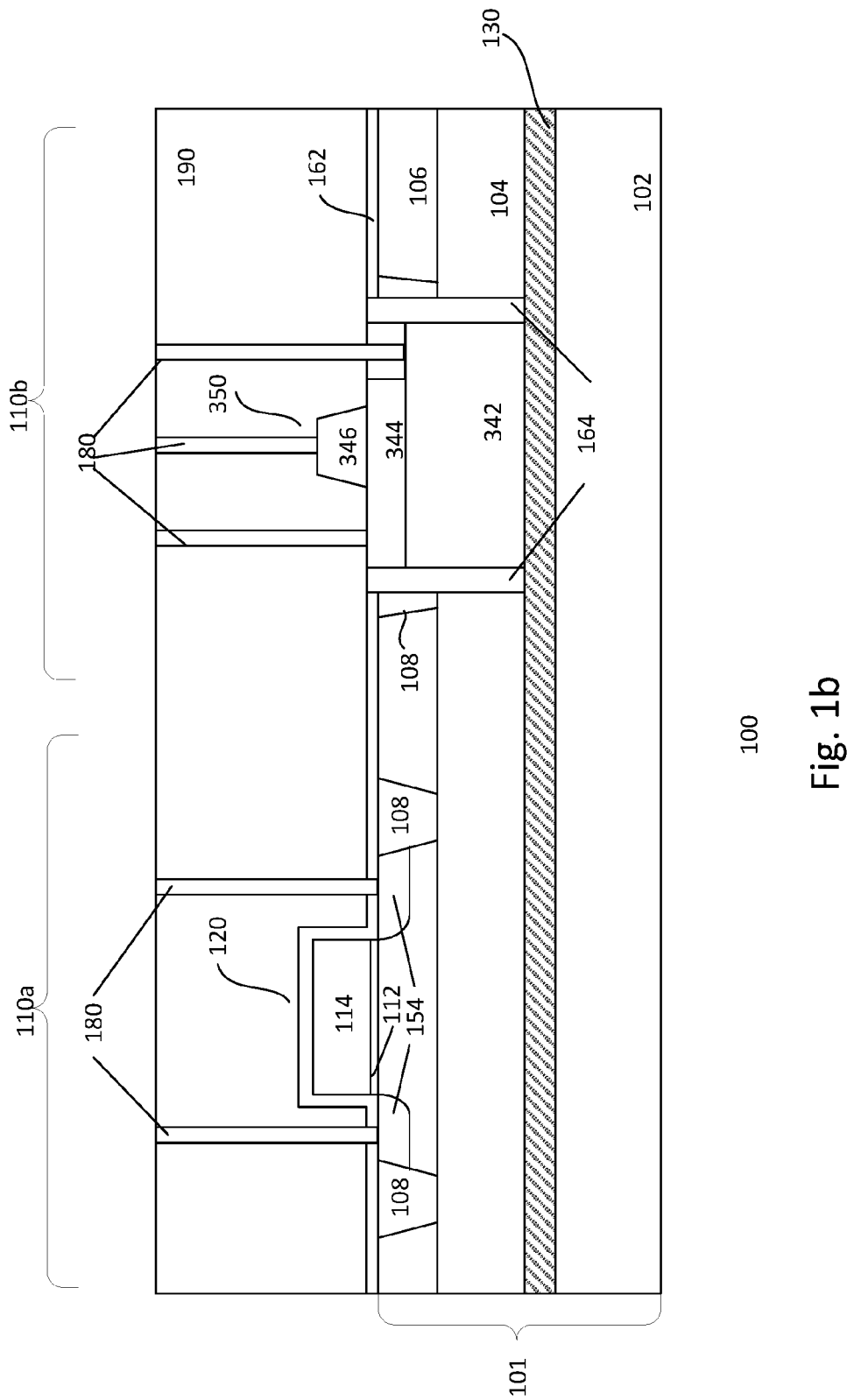
Figure 1C:
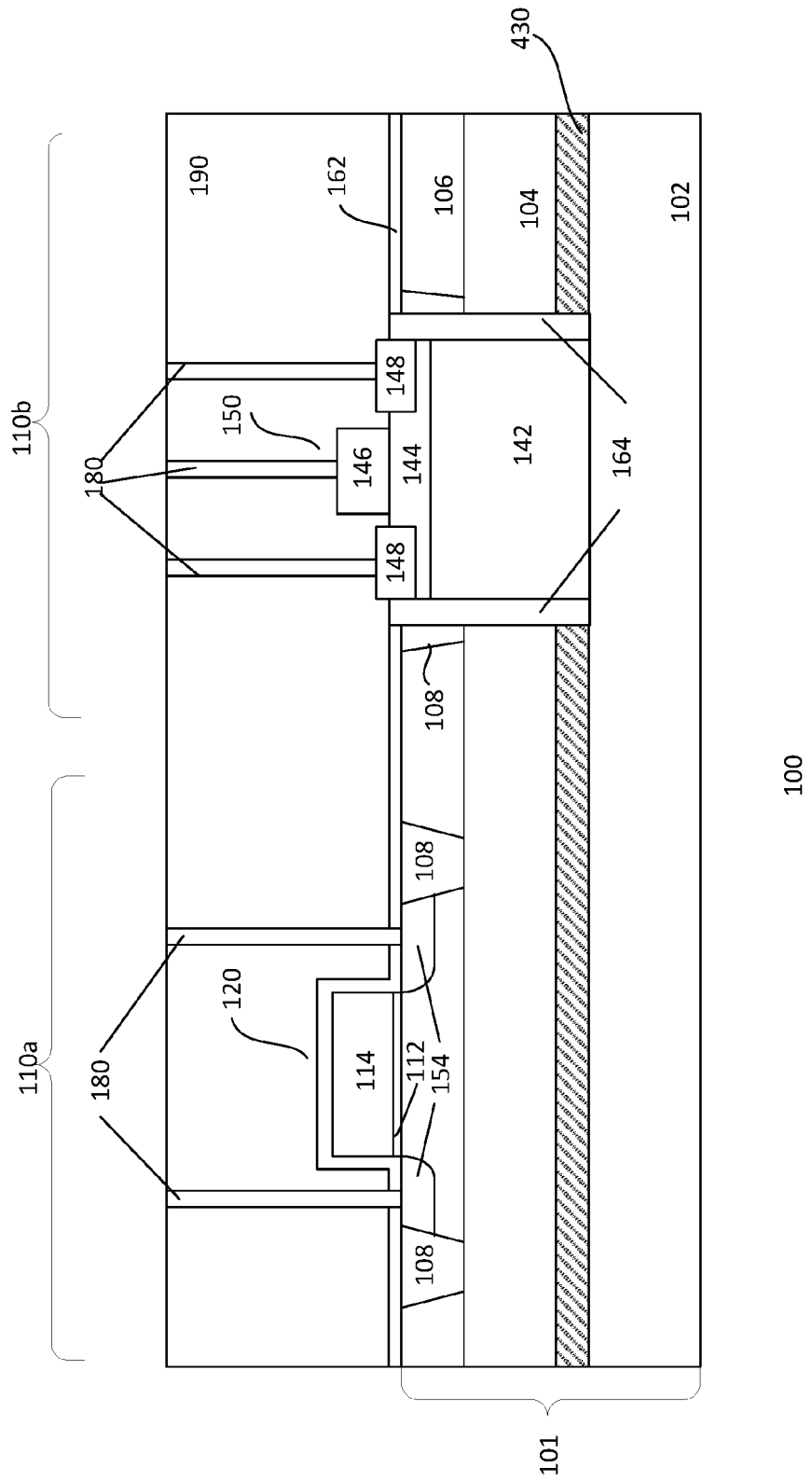
Figure 1D:
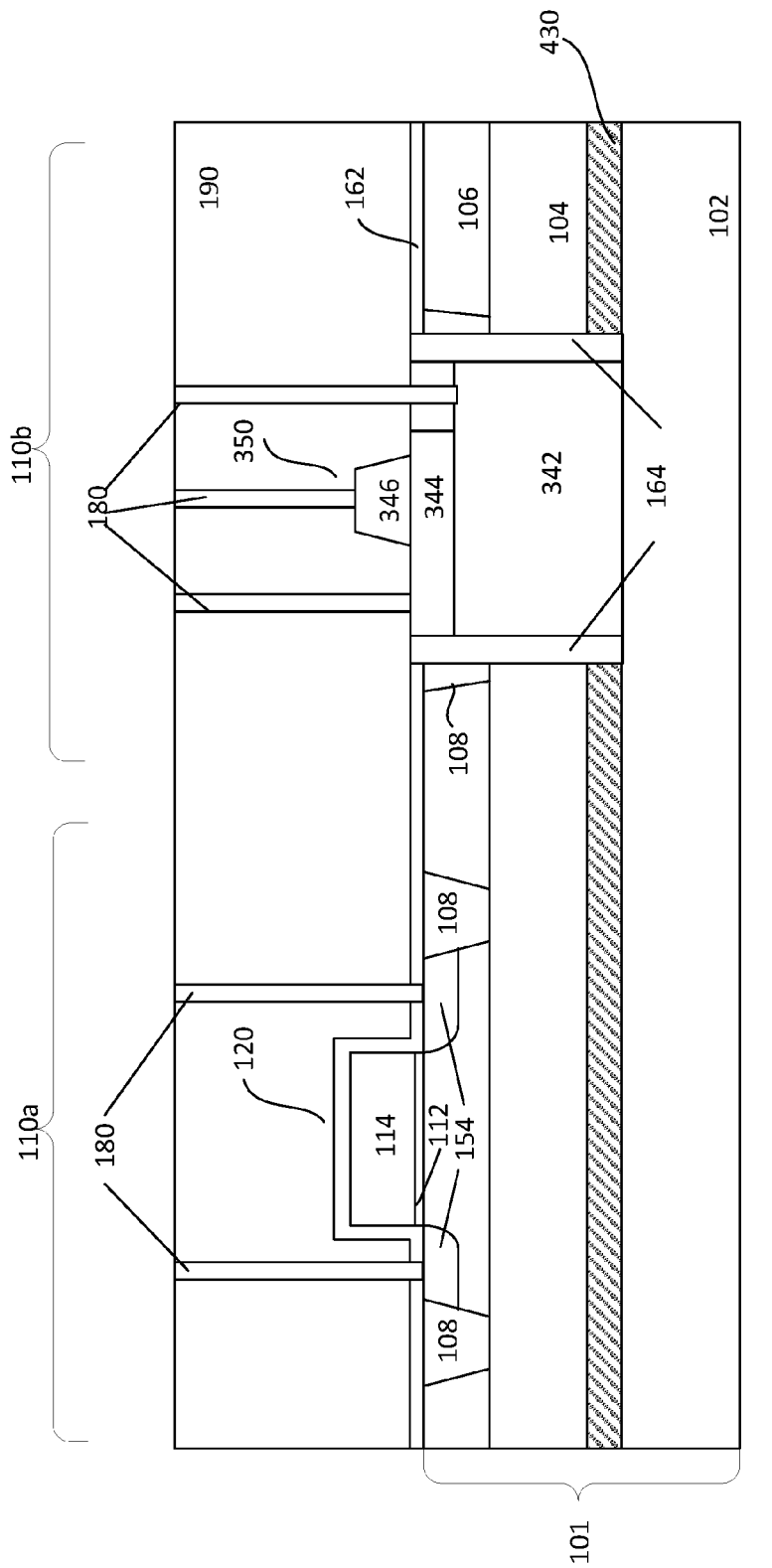

In alternative embodiments, as shown in FIGS. 1b and 1d, the device is similar to that described in FIGS. 1a and 1c. Common elements and features having the same reference numerals may not be described or described in detail. In the interest of brevity, the description of the device shown in FIGS. 1b and 1d below primarily focuses on the difference (s) compared with the device shown in FIG. 1a.

As can be seen in FIGS. 1b and 1d, the second device region 110b includes a wide band gap device. The wide band gap device, for example, includes a HBT device 350 in place of the HEMT device 150 shown in FIG. 1a. The HBT device 350 includes active layers 342, 344 and 346. Active layer 342 may include one or more buffer layers. The buffer layer may include any group III or group V elements suitable for overcoming any thermal expansion and lattice mismatch between the handle substrate 102 and active layer 344. In one embodiment, active layer 342 may be an AlGaN layer and may serve as a collector for HBT device 350. Active layer 344, for example, may include any suitable layer that allows for high carrier mobility. In one embodiment, active layer 344 may serve as a base for HBT device 350 while active layer 346 may serve as emitter for the HBT device. The active layer 346, for example, may be an AlGaN layer. Other suitable materials may also be used as the emitter.

In one embodiment, the active layer 342 is disposed over top surface of the trap rich layer 130 and the protection layers 164 extend from top surface of the top Si layer 106 toward top surface of the trap rich layer 130 as shown in FIG. 1b. Alternatively, the active layer 342 extends through the trap rich layer 430 and is disposed over top surface of the handle substrate 102 while the protection layers 164 extend from top surface of the top Si layer toward top surface of the handle substrate as shown in FIG. 1d. Other suitable configurations of the HBT device may also be useful.

FIGS. 1a and 1b differ from FIGS. 1c and 1d in that the former devices are disposed on trap rich layers 130 formed in accordance with process as shown in FIGS. 2a-2k and FIGS. 3a-3c, whereas the latter devices are formed in accordance with process as shown in FIGS. 4a-4e and FIGS. 5a-5b of which the trap rich layers 430 are formed and prepared by third parties. Trap rich layers provided by third parties may not be the most suitable film for forming HEBT. As shown in FIGS. 1c and 1d, where the devices are formed on trap rich layer 430 provided by third parties, the protective layers 164 extend from the top surface of the top Si layer 106 through the trap rich layer 430 to the top surface of the handle substrate 102. In contrast, as shown in FIGS. 1a-1b, the protective layers 164 of devices extend from the top of the top Si layer 106 to the top of the trap rich layer 130.

FIGS. 2a-2k show cross-sectional views of an embodiment of a process 200 for forming a device. The cross-sectional views are along a channel length direction of the device. The device formed by process 200 is the same as that shown in FIG. 1a. As such, common elements and features having the same reference numerals may not be described or described in detail.

Figure 2A:
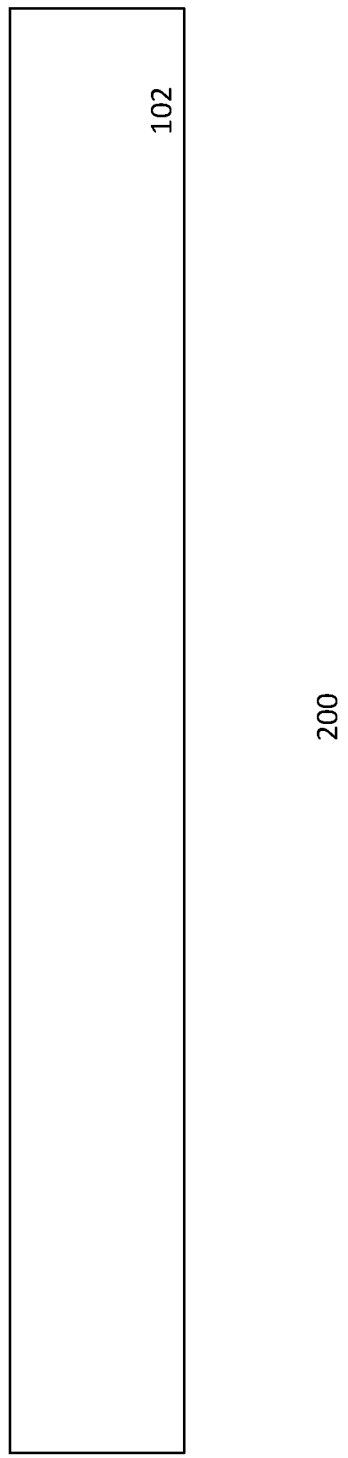

Referring to FIG. 2a, a support or handle substrate 102 is provided. The support substrate 102, in one embodiment, includes a substrate with first crystal orientation. In one embodiment, the support substrate includes a <111> oriented single crystal substrate. The support substrate, for example, is a <111> Si substrate. Other suitable types of semiconductor substrate with <111> orientation may also be useful. The support substrate, for example, may be lightly doped with first polarity type dopants, such as p-type dopants. Providing a support substrate which is lightly doped with second polarity type dopants, such as n-type dopants, may also be useful. P-type dopants may include boron (B), aluminum (Al), indium (In) or a combination thereof, while n-type dopants may include phosphorus (P), arsenic (As), antimony (Sb) or a combination thereof.

Figure 2B:
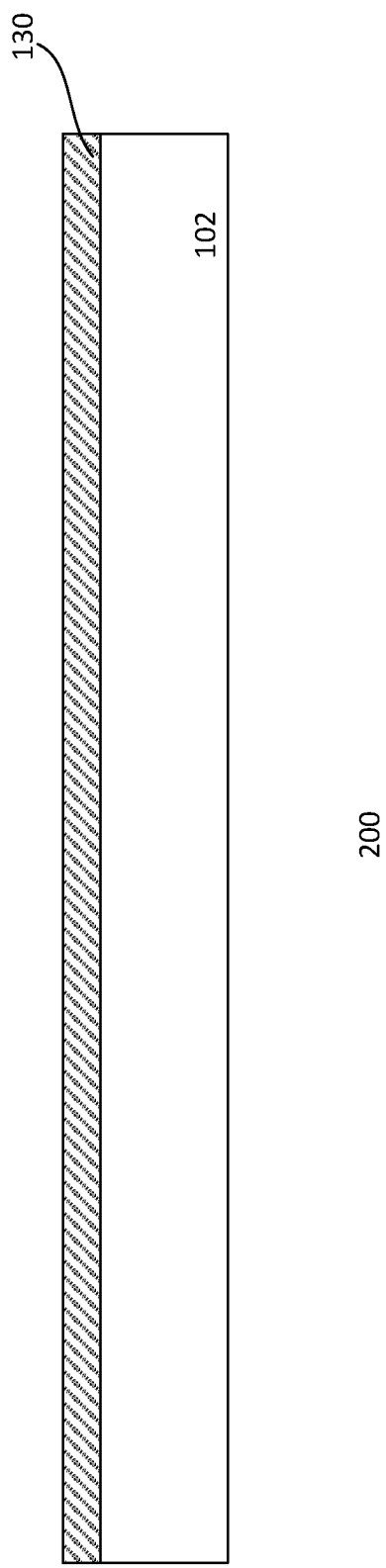

The process 200 continues to form a trap rich layer 130 on the handle substrate 102. In one embodiment, the trap rich layer 130 is formed by growing a thin layer of wide band gap material on top of the handle substrate as shown in FIG. 2b. The trap rich layer 130, for example, may be formed using nano-crystal Si or any wide band gap material having characteristics suitable to match with active layers of wide band gap devices, such as but not limited to HEMT and HBT devices. The wide band gap material used for forming the trap rich layer, for example, includes GaN, AlGaN, GaAs, SiC, etc. Other suitable wide band gap materials may also be useful. The trap rich layer generally has a thickness of about 1.8-2 μm. Other suitable thickness dimensions may also be useful.

In FIG. 2c, an insulator layer 104 is formed over the trap rich layer 130. The insulator layer, for example, includes a dielectric insulating material. The insulator layer, for example, is formed from silicon oxide, providing a BOX layer. Other suitable types of dielectric insulating materials may also be useful. Various techniques, such as H implant or thermal oxidation using furnace annealing, may be employed to form the insulator layer 104. Other suitable techniques may also be used to form the insulator layer.

Figure 2D:
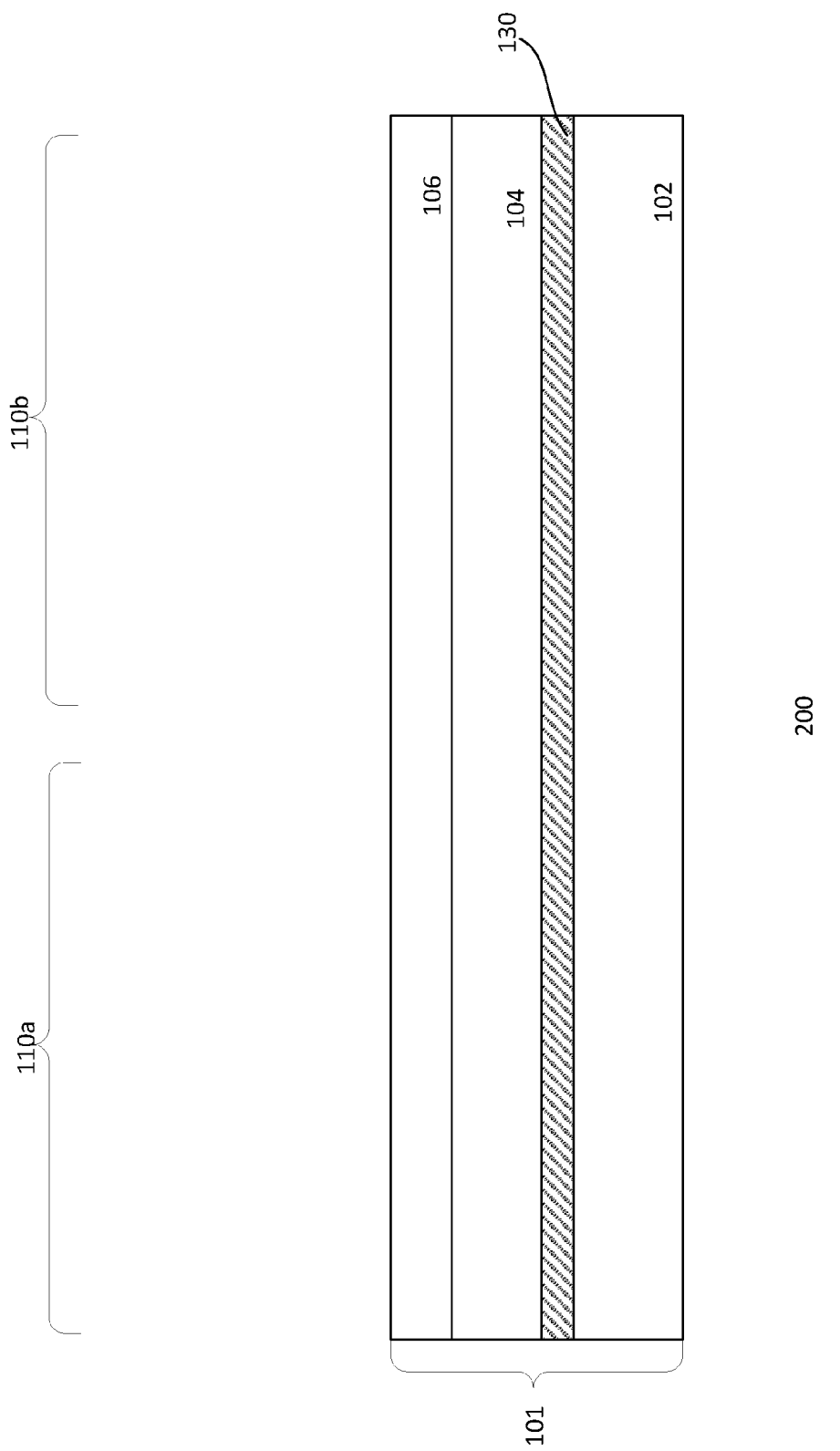

FIG. 2d shows that a top surface layer 106 is formed on the insulator layer 104. The top surface layer, for example, includes a semiconductor material. The top surface layer, in one embodiment, includes a semiconductor layer with second crystal orientation. In one embodiment, the top surface layer includes a <100> oriented single crystal layer. The top surface layer, for example, is a <100> Si layer. In this case, the top surface layer may be referred to as the top Si layer and the substrate 101 is a SOI substrate. Other suitable types of substrate materials or any other semiconductor materials may also be useful. In one embodiment, the top surface layer and the support substrate include the same material. The top surface layer and the support substrate may also include different materials.

Figure 2E:
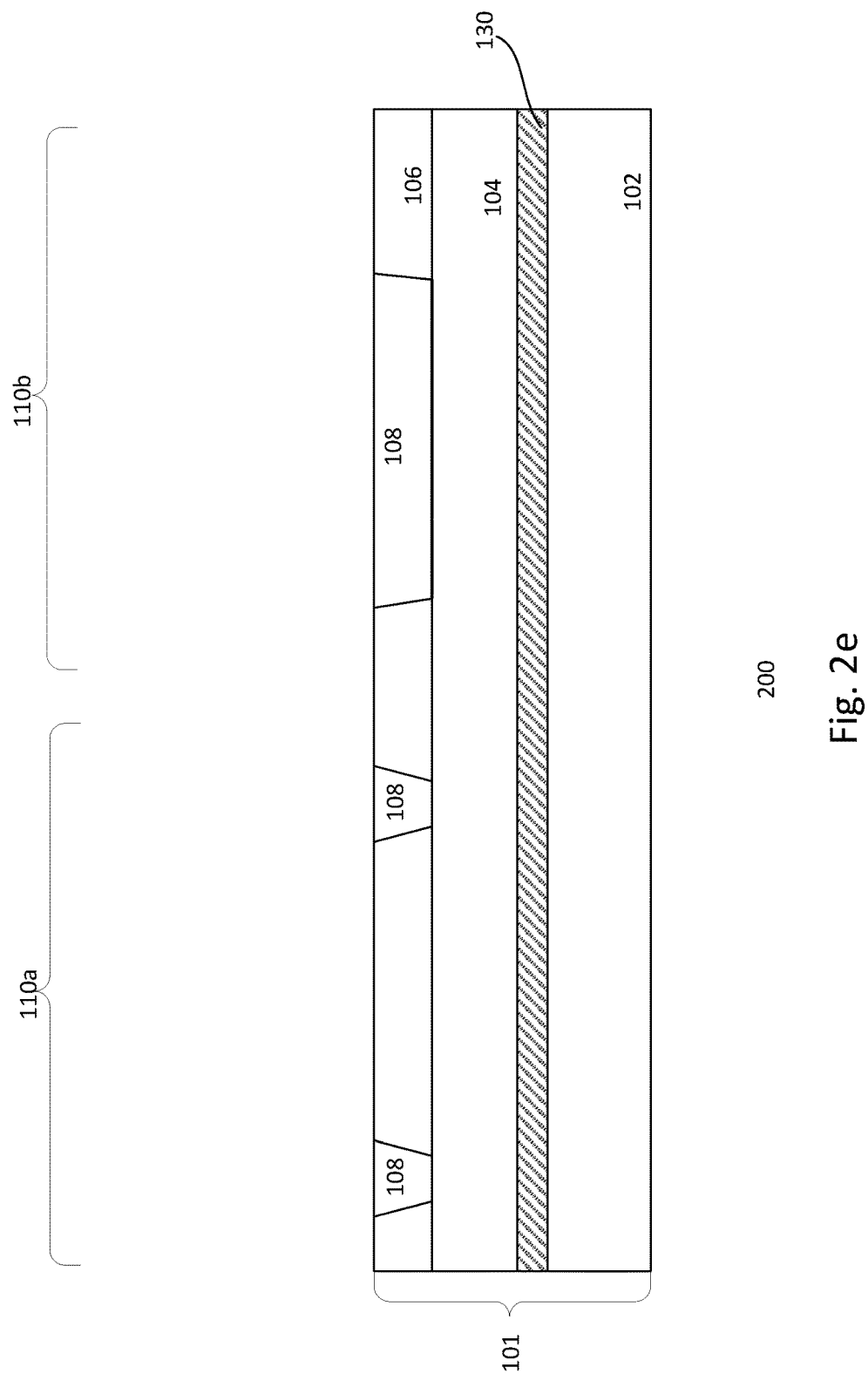

Referring to FIG. 2e, the process continues to form isolation regions 108 in the top surface layer 106 to isolate devices in the different device regions, e.g., first device region 110a from second device region 110b. Although only first and second device regions 110a and 110b are shown in FIG. 2e, it is understood that the substrate may include other device regions. The isolation regions 108 are, for example, STI regions. The STI region, for example, extends from top surface of the top surface layer 106 to the surface of the insulator or BOX layer 104. Providing isolation regions which extend to other depths may also be useful. Various processes can be employed to form the STI regions. For example, the top surface layer can be etched using etch and mask techniques to form trenches which are then filled with dielectric materials, such as silicon oxide. Chemical mechanical polishing (CMP) can be performed to remove excess oxide and provide a planar substrate top surface. Other processes or materials can also be used to form the STI regions. In one embodiment, the STI region 108 in the second device region 110b may include a width greater than the width of the STI region 108 in the first device region 110a as shown in FIG. 2e. The STI region 108 in the second device region 110b provides sufficient isolation and also simplifies the processing of the wide band gap devices in the second device region 110b as will be described later.

Figure 2F:
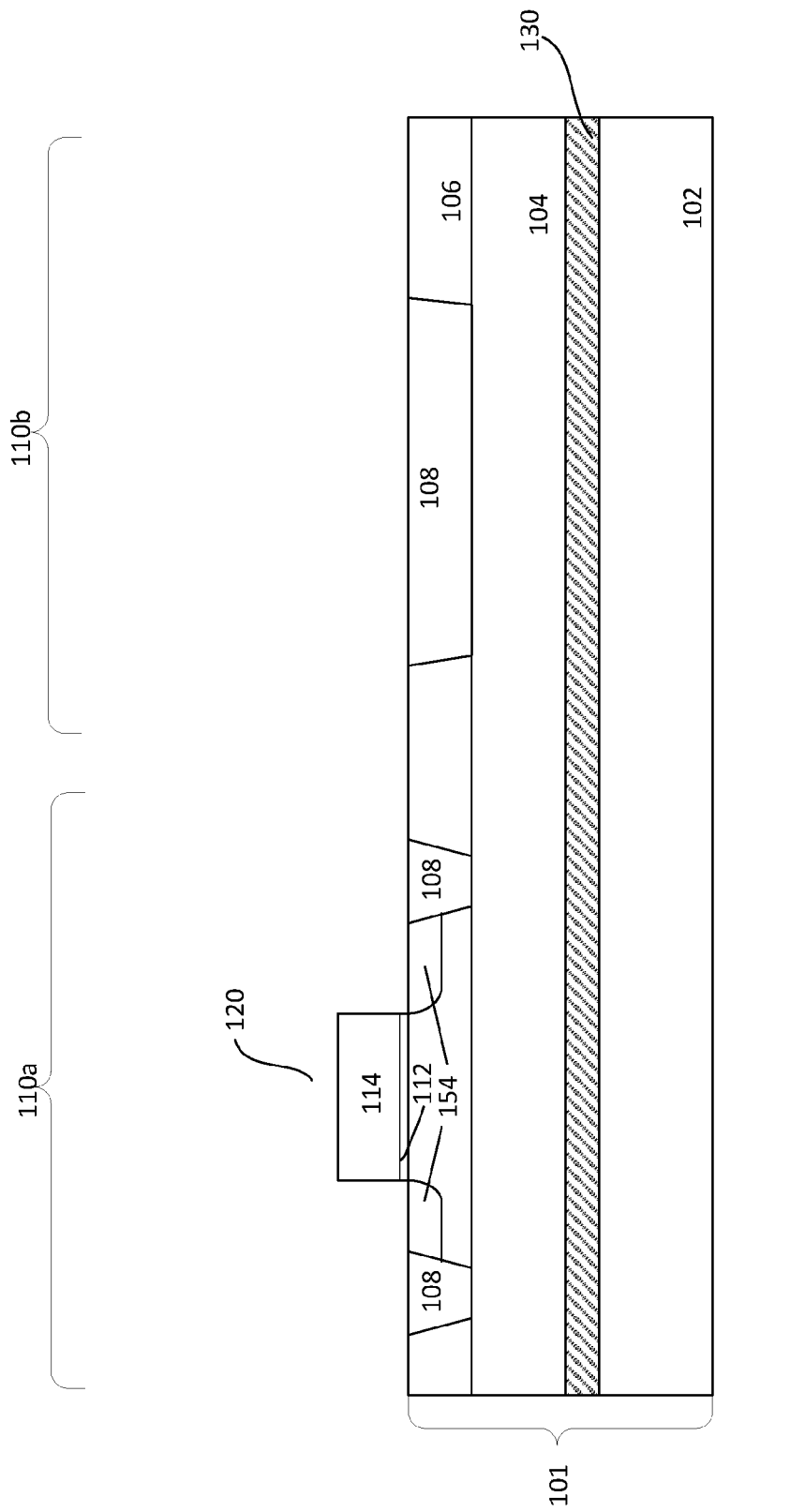

In FIG. 2f, a gate dielectric layer is formed over the top surface layer and a gate electrode layer is formed over the gate dielectric layer. The gate dielectric layer, for example, includes silicon oxide while the gate electrode layer, for example, includes a polysilicon layer. The gate dielectric layer may be formed by thermal oxidation while the gate electrode layer may be formed by chemical vapor deposition (CVD) process. Other suitable types of materials and forming techniques may be employed for the gate dielectric and electrode layers. The gate dielectric and electrode layers are patterned by a mask layer (not shown) to form a gate of a transistor 120 in the first device region 110 as shown in FIG. 2f. The gate of the transistor includes a gate dielectric 112 and a gate electrode or gate poly 114 thereon.

FIG. 2f also shows the formation of heavily doped diffusion regions 154 adjacent to sidewalls of the gate in the top surface layer 106. The heavily doped regions, for example, serve as the S/D regions of the transistor. The heavily doped regions, for example, have first polarity type dopants for a first polarity type transistor. Forming the heavily doped regions includes implanting first polarity type dopants into the top surface layer of the substrate. For example, the implant may be introduced into the substrate using an implant mask. Thus, a transistor 120 is formed. Although only one transistor is shown, it is understood that there could be more than one transistor formed on the same substrate. Furthermore, it is also understood that the process may also include forming lightly doped diffusion regions in the top surface layer and sidewall spacers on sidewalls of the gate and forming other suitable active or passive component/devices (not shown).

Figure 2G:
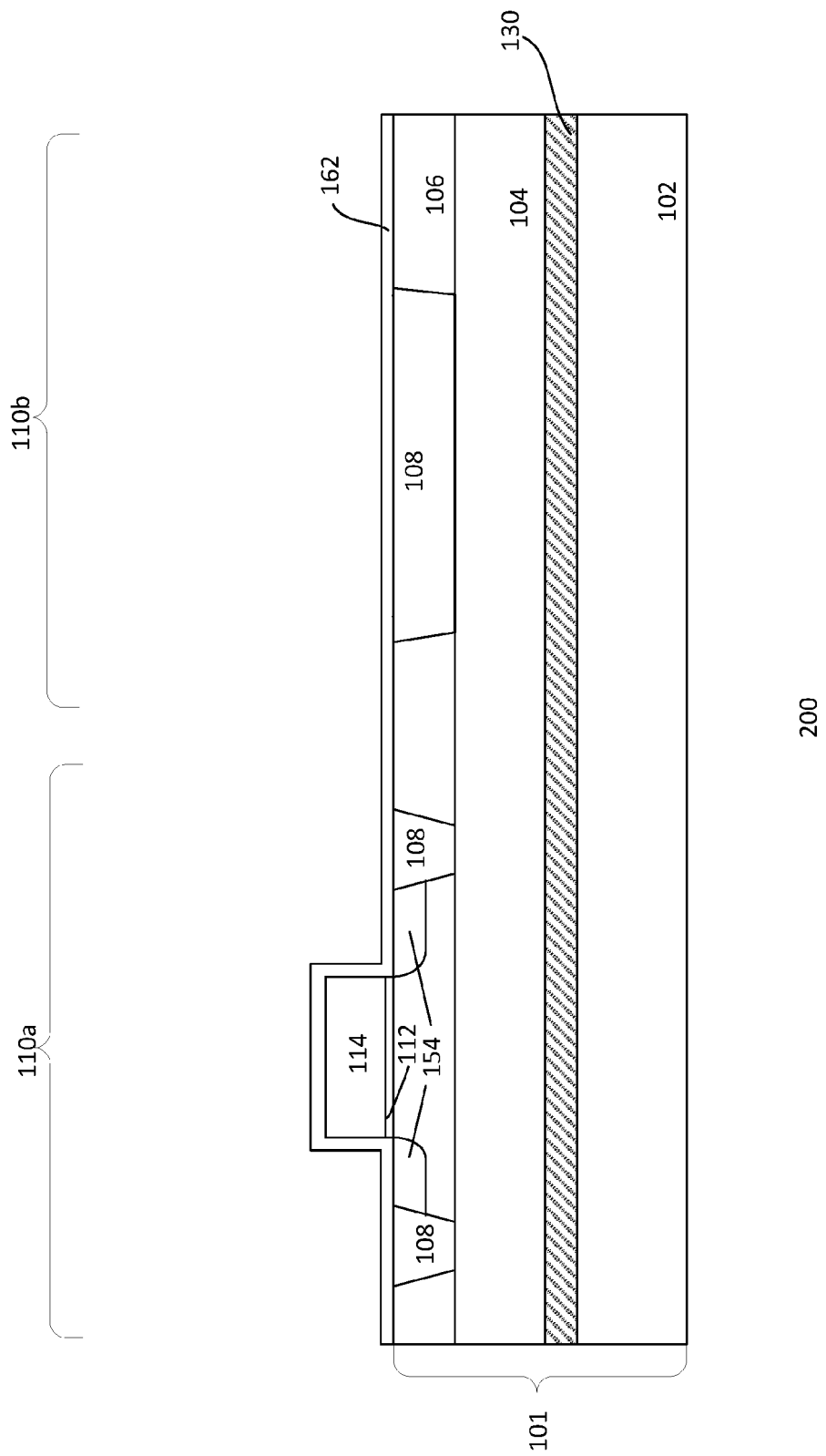

In FIG. 2g, the process continues to form an etch stop layer 162 over the top surface layer 106. The etch stop layer, as shown, covers the surface of the top surface layer and the gate of the transistor. In one embodiment, the etch stop layer 162 may be a nitride layer. The etch stop layer may be formed over the top surface layer by CVD. Other suitable dielectric material and techniques may also be used for forming the etch stop layer.

Figure 2H:
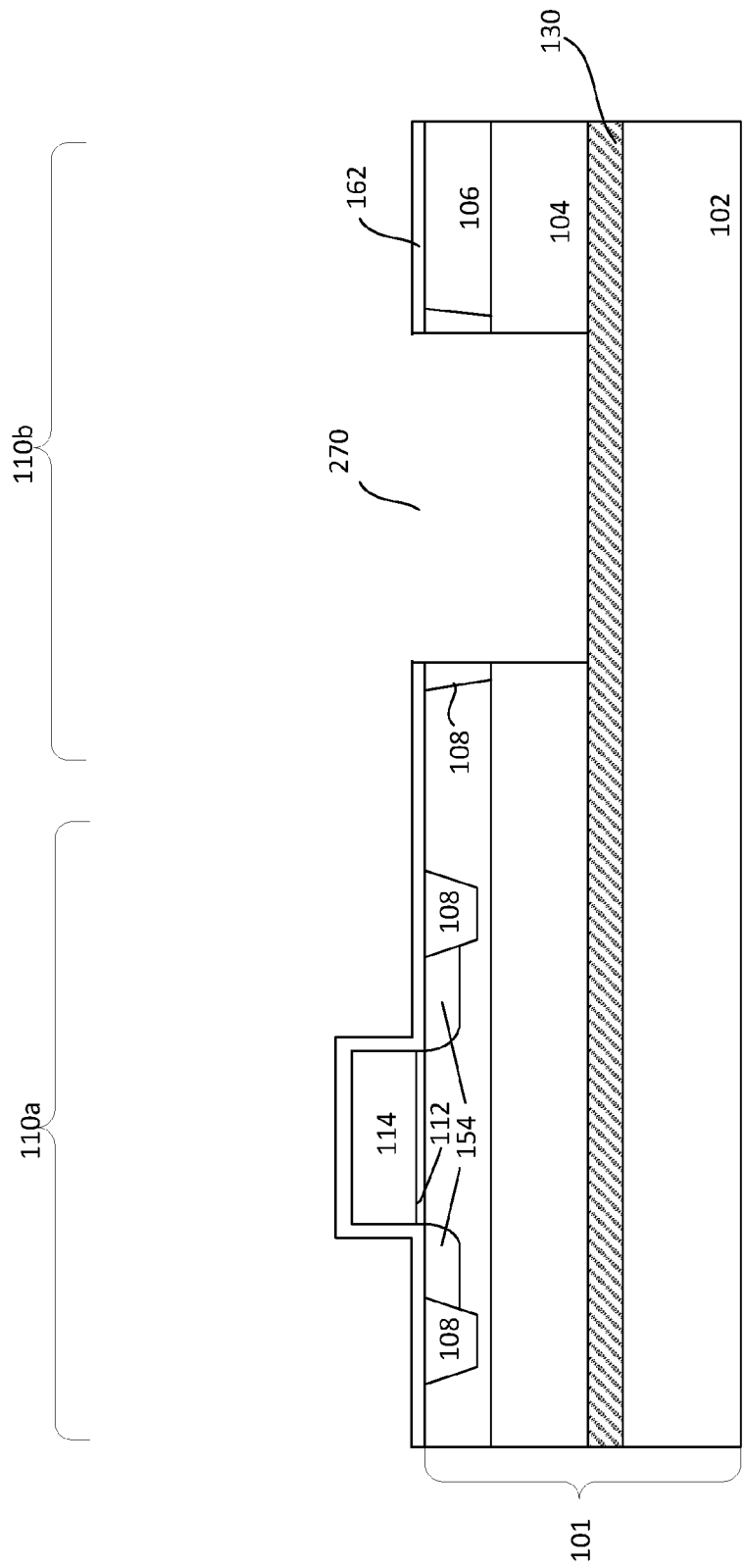

Referring to FIG. 2h, the process continues to define an active area for wide band gap devices in the second device region 110b. In one embodiment, an etch process is performed to remove a portion of the isolation region 108 in the second device region and exposes the insulator layer 104 and a portion of the trap rich layer 130. The opening 270 should be sufficiently wide to allow for the formation of wide band gap devices such as HEMT and HBT, but forming other wide band gap devices may also be useful. The remaining portions of the isolation region 108 in the second device region serve to isolate the wide band gap material from the top surface layer 106, thereby preventing electrical shorts. As the isolation region 108 and the insulator layer 104 are formed by the same material, the etching process is simplified.

Figure 2I:
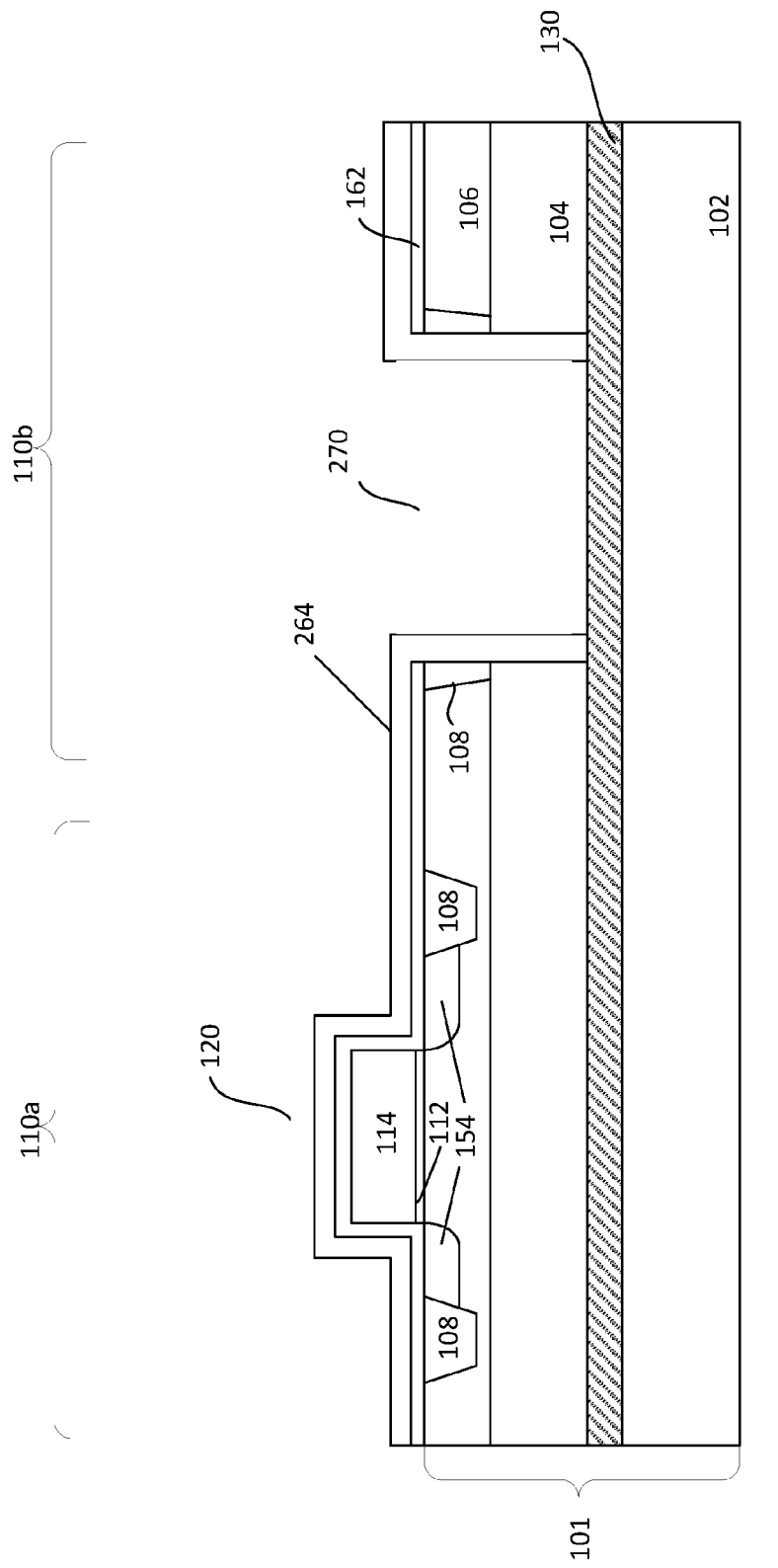

Referring to FIG. 2i, a protective layer 264 is formed on both first and second device regions 110a and 110b. The protective layer, for example, is formed by CVD and covers the transistor in the first device region and also sidewalls and bottom of the opening 270. The protective layer 264 may include TEOS, SiN or a combination thereof. Other suitable dielectric materials and techniques for forming the protective layer may also be useful. The process continues to remove a portion of the protective layer 264 above the trap rich layer 130. The portion of the protective layer above the trap rich layer is removed by, for example, reactive ion etch (RIE). Other suitable removal technique may also be employed. The protective layer 264 protects the device in the first device region during processing of the second device region and covers the sidewalls of the opening in second device region 110b.

Figure 2J:
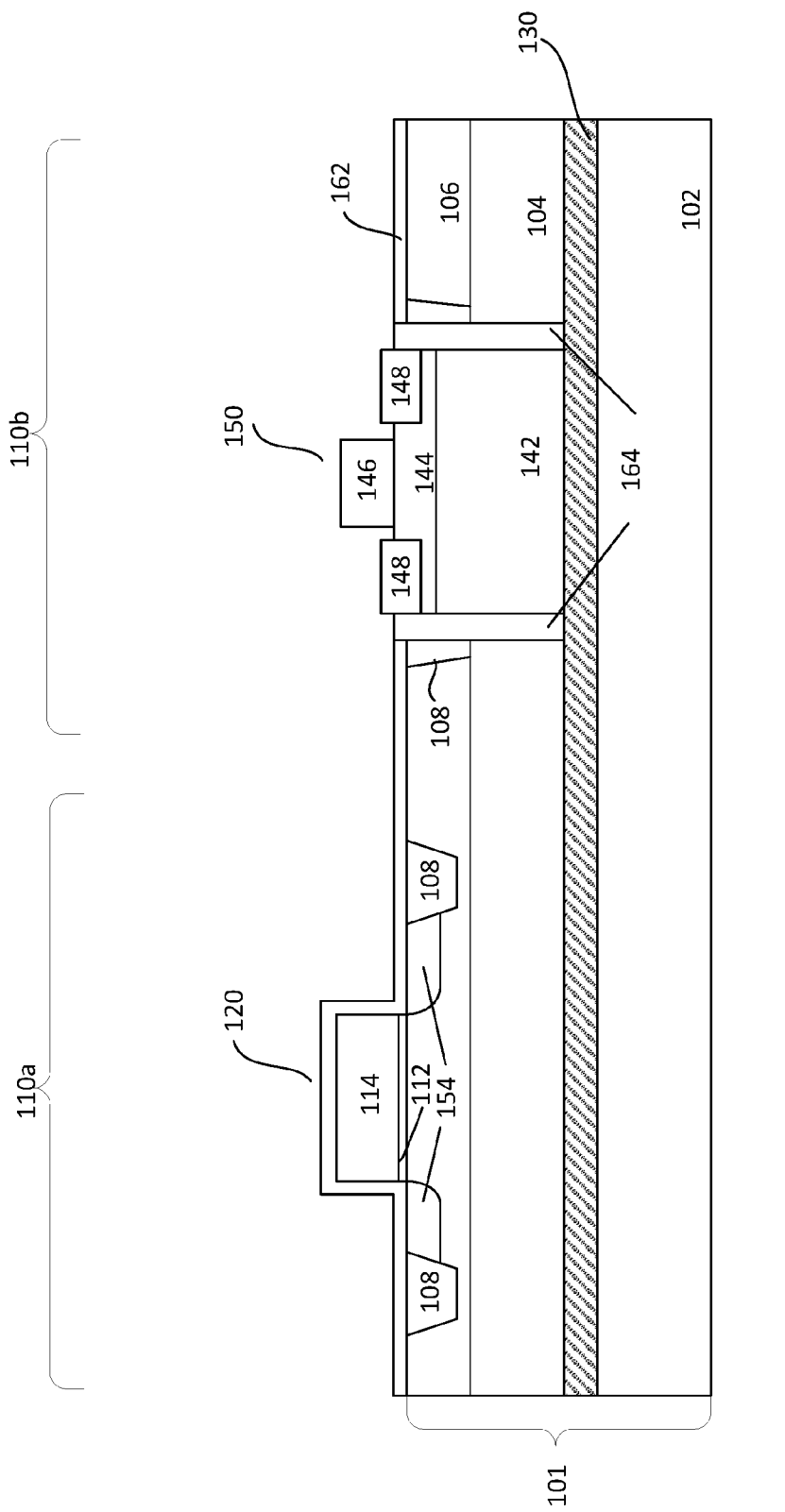

In FIG. 2j, the process 200 continues to form wide band gap device in the second device region 110b. In one embodiment, the process continues to form a HEMT device 150. For example, the process continues with epitaxial growth of buffer layer 142 over the exposed portion of the trap rich layer 130 and forming a channel layer 144 over the buffer layer by epitaxial growth. In the case of a HEMT device, the buffer layer 142, for example, includes suitable group III or group V elements, such as but not limited to GaN. The channel layer 144, for example, includes AlGaN or any suitable material which allows for high carrier mobility. This is followed by the formation of S/D regions 148 and gate layer of the HEMT device. The gate layer is patterned to form the gate 146 of the HEMT device 150. The protective layer 264 over the etch stop layer in both device regions 110a and 110b is removed. As shown, protective layers 164 lining sidewalls of the opening remain to further isolate the wide band gap device from other regions.

Figure 2K:
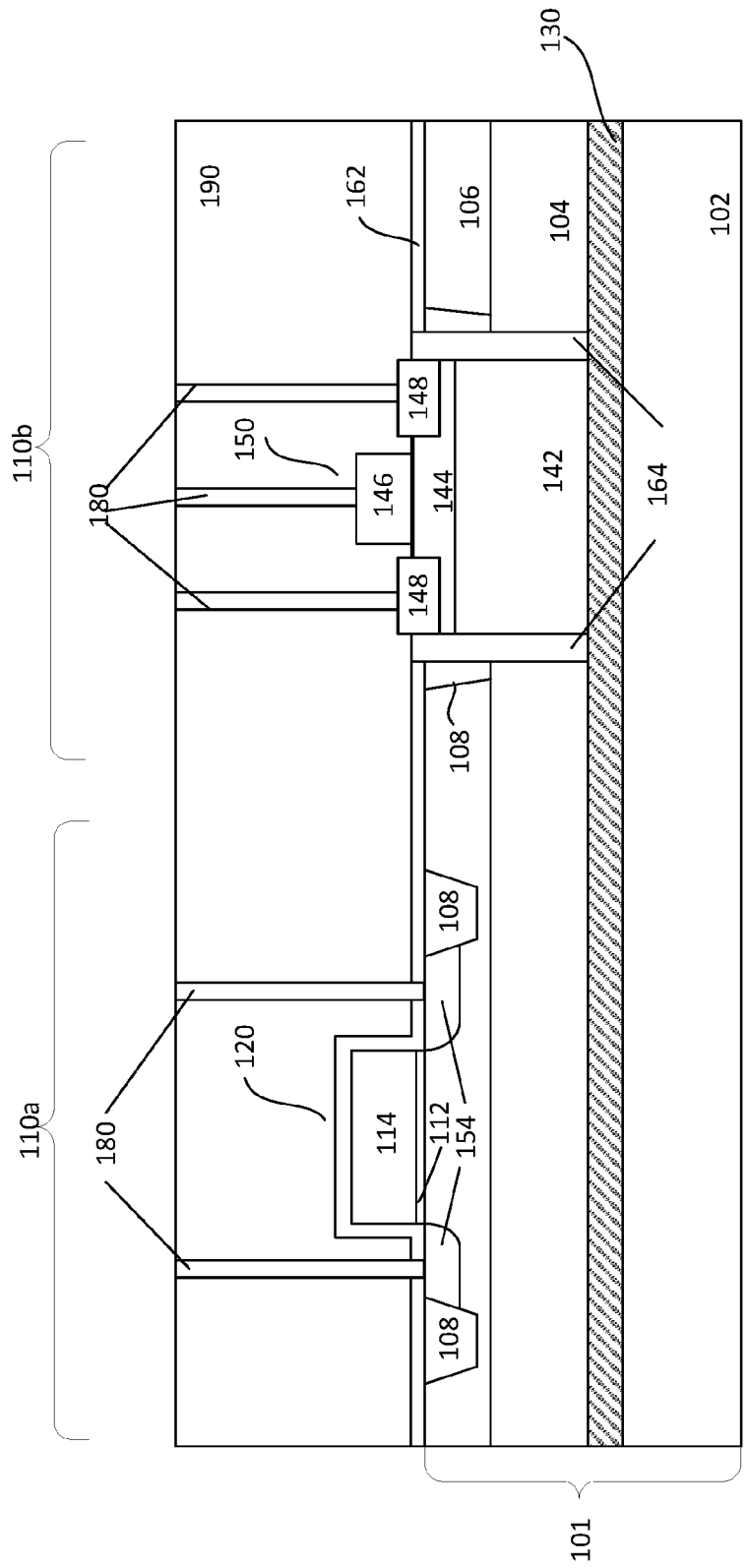

Referring to FIG. 2k, the process continues to form a dielectric layer or an ILD layer 190 over the top surface layer 106. The dielectric layer 190, for example serves as a pre-metal dielectric (PMD) layer. The process continues to form via contacts or contact plugs 180 within the ILD layer 190 and are connected to the contact regions, such as S/D regions of both the transistor and HEMT devices in the first and second regions. To form via contacts, via openings are patterned in the ILD layer using suitable mask and etch technique. An anisotropic etch, such as RIE, is used to form the via openings.

The via openings expose contact regions of the transistor and HEMT. A conductive layer is deposited on the substrate, filling the via openings. For example, a tungsten layer may be formed by sputtering to fill the via openings. Other suitable conductive material may also be useful. A planarizing process, such as CMP, is performed to remove excess conductive material, forming the via contacts 180. The process may continue to perform back-end-of-line (BEOL) process which includes forming interconnect metal levels having a plurality of low-k dielectric layers which include interconnections coupled to contact regions of the transistor and HEMT and other circuit components, as desired.

Figure 3A:
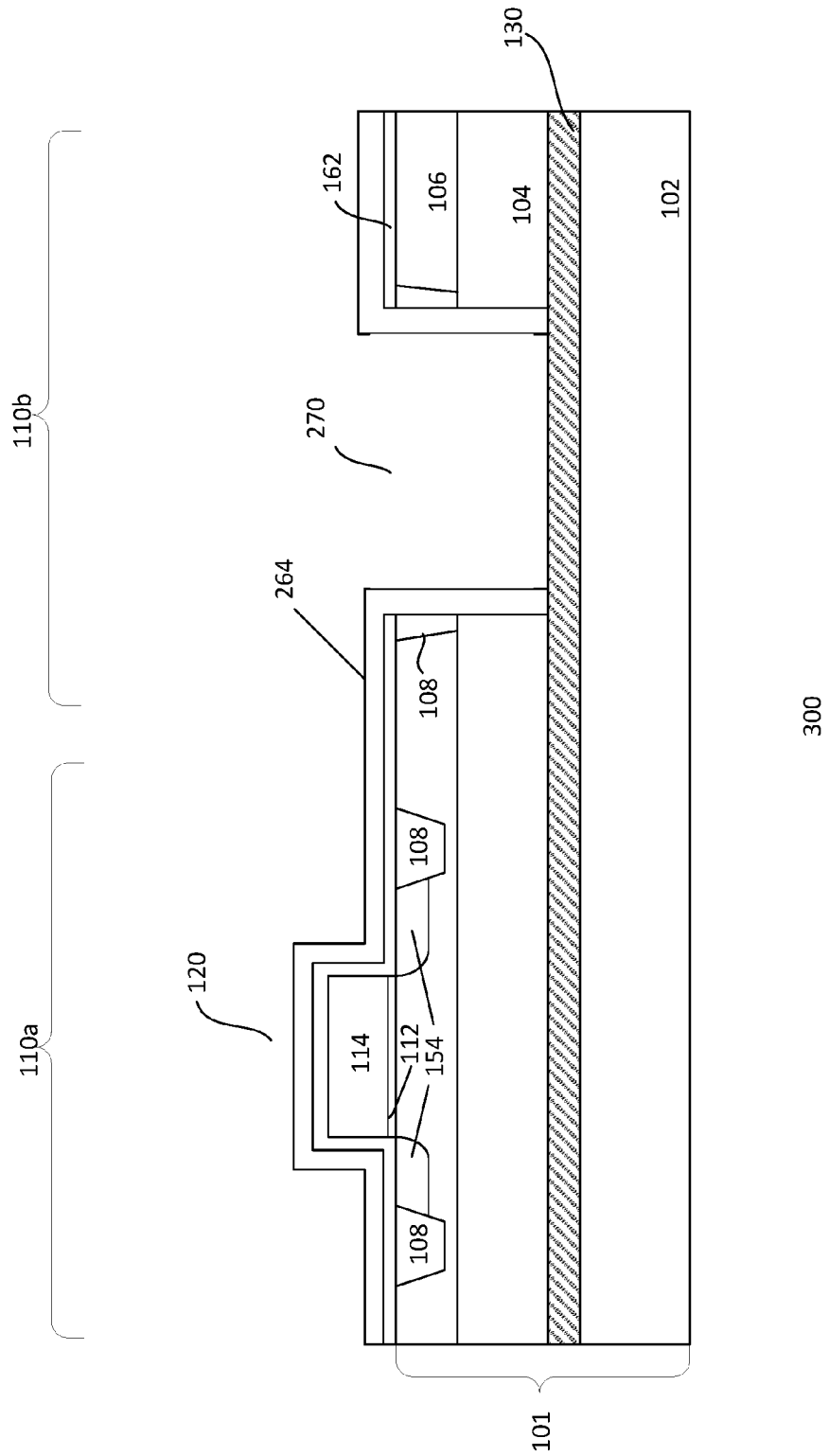
FIGS. 3a-3c show cross-sectional views of alternative steps to the embodiment of a process for forming a device.
Figure 3B:
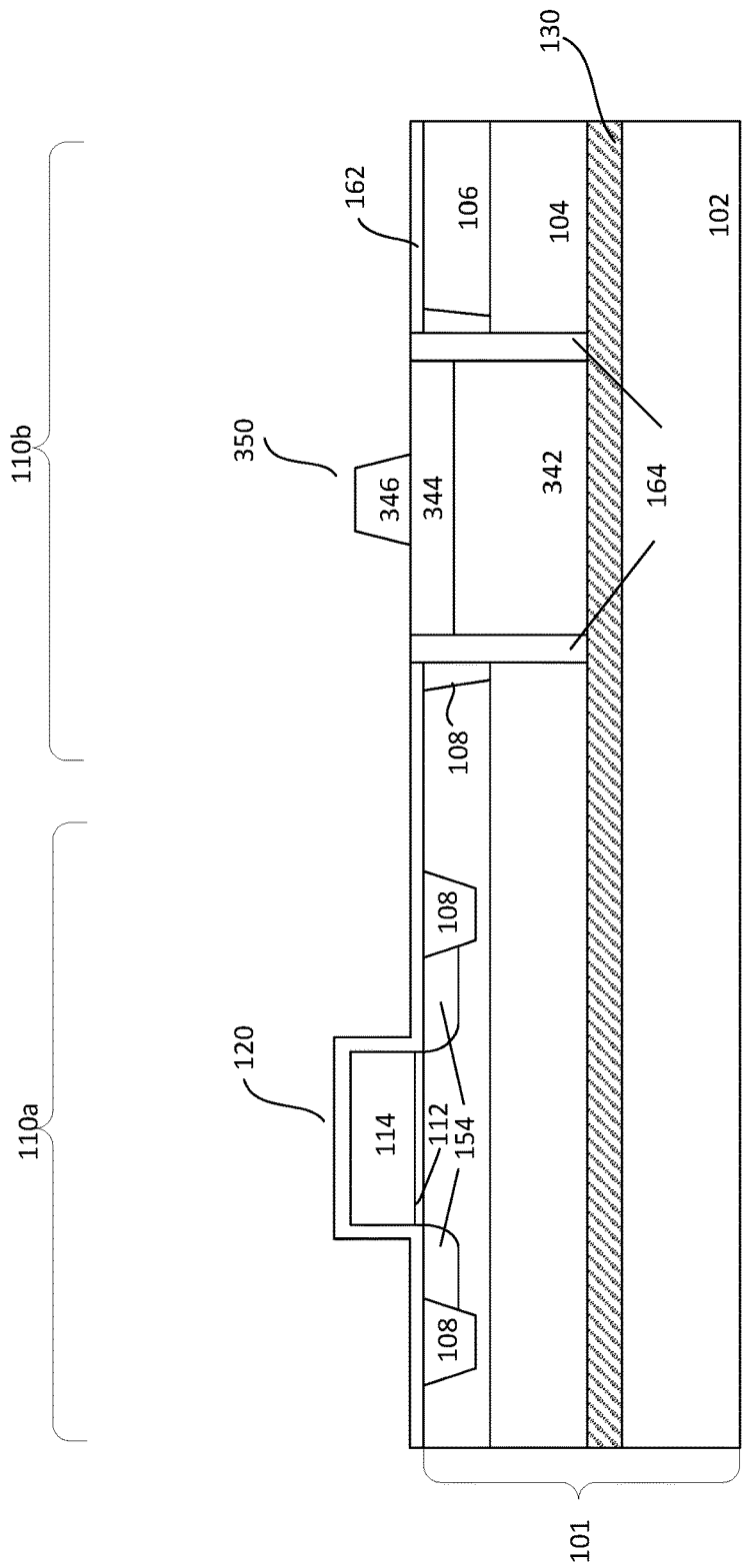
Figure 3C:
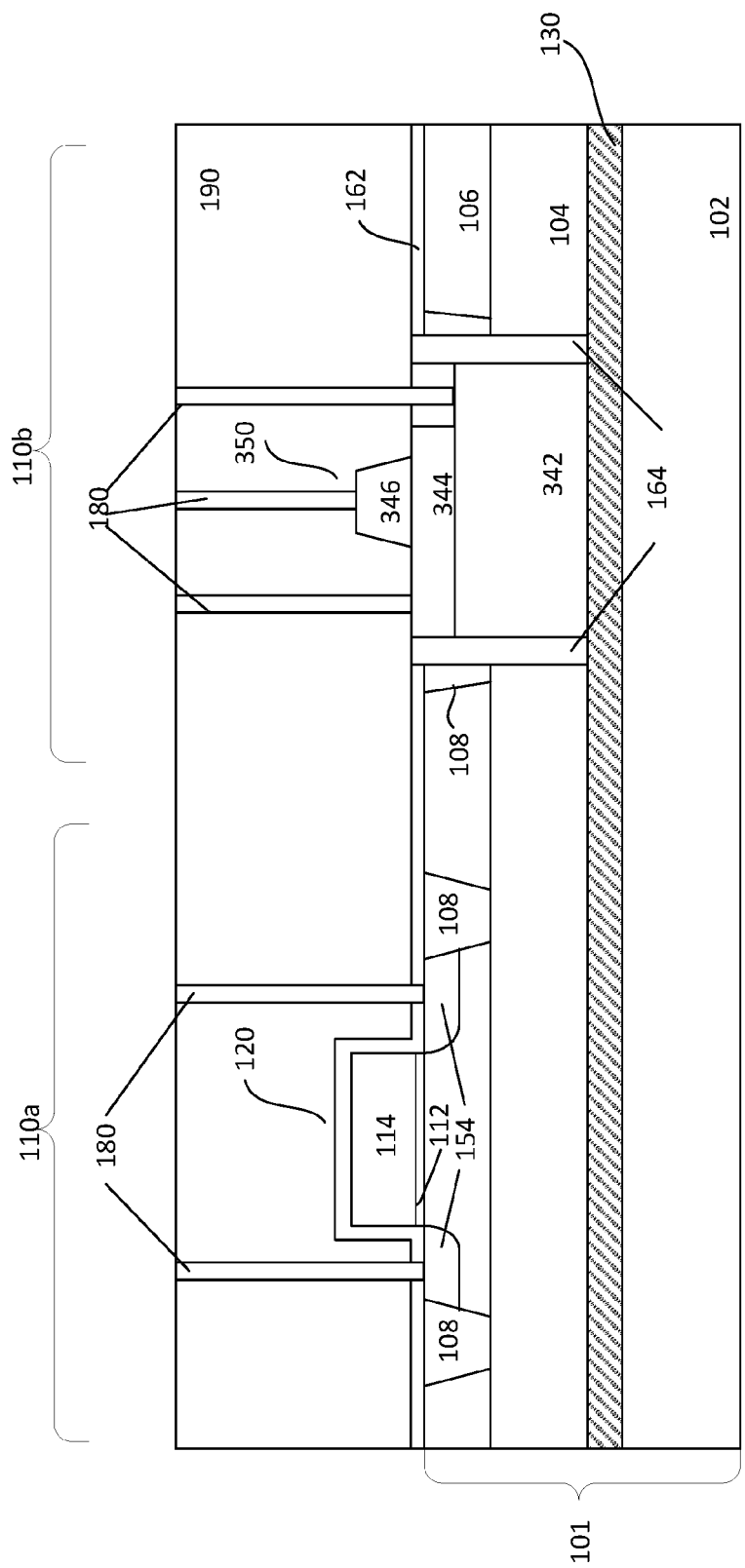

FIGS. 3a-3c show cross-sectional views of alternative steps to the embodiment of a process for forming a device. The device formed by process 300 is the same as that shown in FIG. 1b. As can be seen, FIG. 3a is identical to FIG. 2i. For example, the substrate is processed up to the stage where an opening 270 is formed in the second device region 110b as described in FIG. 2i. However, FIGS. 3b and 3c differ from FIGS. 2j-2k. In the interest of brevity, common elements and features having the same reference numerals may not be described or described in detail. As such, the description of the process in FIGS. 3b-3c primarily focuses on the difference(s) between the process shown in FIGS. 2j-2k and the process shown in FIGS. 3b-3c.

Referring to FIG. 3b, the process continues to form a wide band gap device in the second device region 110b. In one embodiment, the wide band gap device is a HBT device 350. For example, for illustration purpose, the process continues with epitaxial growth of active layers 342, 344 and 346 of the HBT device. The layer 342 may include one or more buffer layers. The buffer layer may include any group III or group V elements suitable for overcoming any thermal expansion and lattice mismatch between the handle substrate 102 and active layer 344. The layer 342, for example, may be an AlGaN layer and may serve as a collector for HBT device 350. Active layer 344, for example, may include any suitable layer that allows for high carrier mobility. In one embodiment, active layer 344 may serve as a base for HBT device 350 while active layer 346 may serve as emitter for the HBT device. The active layer 346, for example, may be an AlGaN layer. Other suitable materials may also be used as the emitter layer. The emitter layer 346 is patterned to form the emitter of the HBT device. The protective layer 264 over the etch stop layer in both device regions 110a and 110b is removed. As shown, protective layers 164 lining sidewalls of the opening remain to further isolate the wide band gap device 350 from other regions.

Referring to FIG. 3c, the process continues to form via contacts or contact plugs 180 in the dielectric layer 190. The materials and techniques for forming the via contacts are the same as that described in FIG. 2k. The via contacts 180, for example, are connected to the S/D regions of the transistor 120 in the first device region as well as the base, emitter and collector of the HBT device 350 in the second device region.

FIGS. 4a-4e show cross-sectional views of an alternative embodiment of a process 400 for forming a device. The device formed by process 400 is the same as that shown in FIG. 1c. The process 400 is similar to the process 200 as described with respect to FIGS. 2a-2k. As such, common elements and features having the same reference numerals may not be described or described in detail.

Figure 4A:
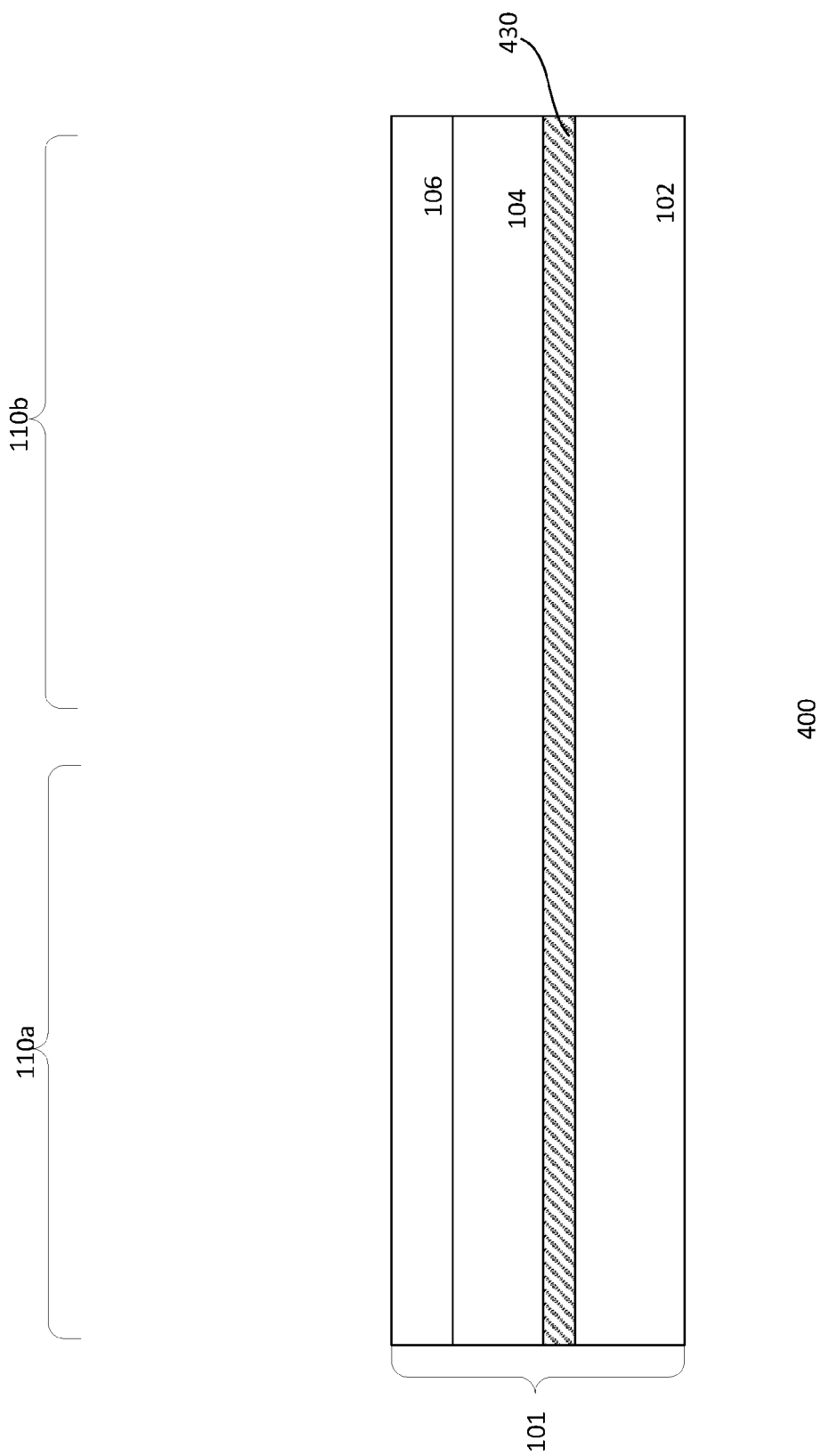
FIGS. 4a-4e show cross-sectional views of an alternative embodiment of a process for forming a device.

Referring to FIG. 4a, the process starts with providing a substrate 101. The substrate, for example, includes a SOI substrate which may be prepared by a third party. As shown, the substrate includes a handle substrate 102, an insulator layer 104 and a top surface layer 106 with a trap rich layer 430 already formed in between the handle substrate and the insulator layer. The handle substrate includes a substrate with first crystal orientation (e.g., <111> Si substrate) while the top surface layer may include a semiconductor layer with second crystal orientation (e.g., <100> Si layer). The trap rich layer, for example, may be formed by polysilicon deposition and temperature treatment prior to formation of the insulator layer, or ion implantation to the surface of the handle substrate or any other suitable techniques used by the third party.

Figure 4B:
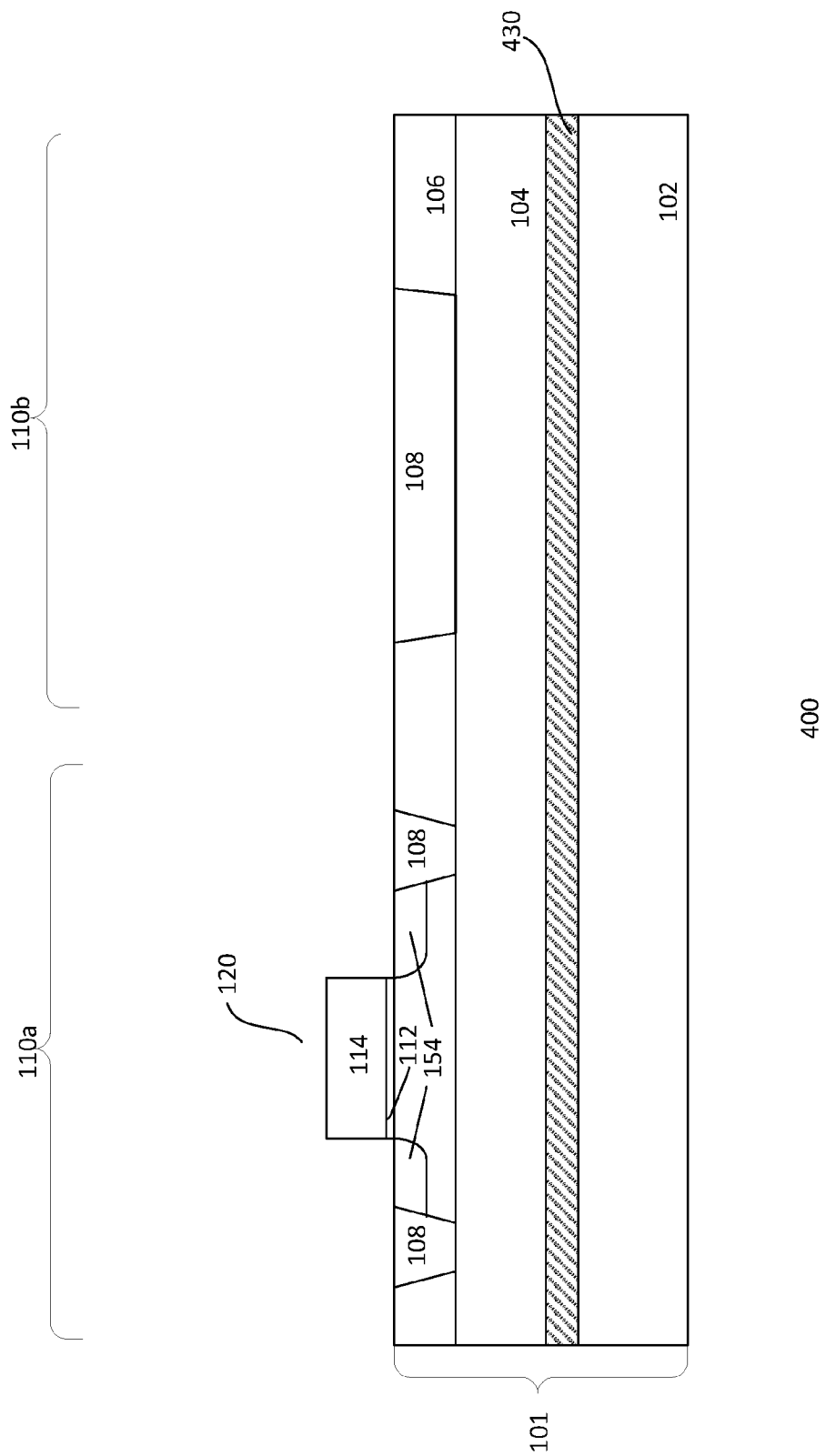

In FIG. 4b, the process 400 continues to form isolation regions 108 in the top surface layer 106 in both first and second device regions. A transistor 120 is formed in the first device region 110a. The materials and techniques to form the isolation regions 108 and transistor 120 are the same as that described in FIGS. 2e-2f.

Figure 4C:
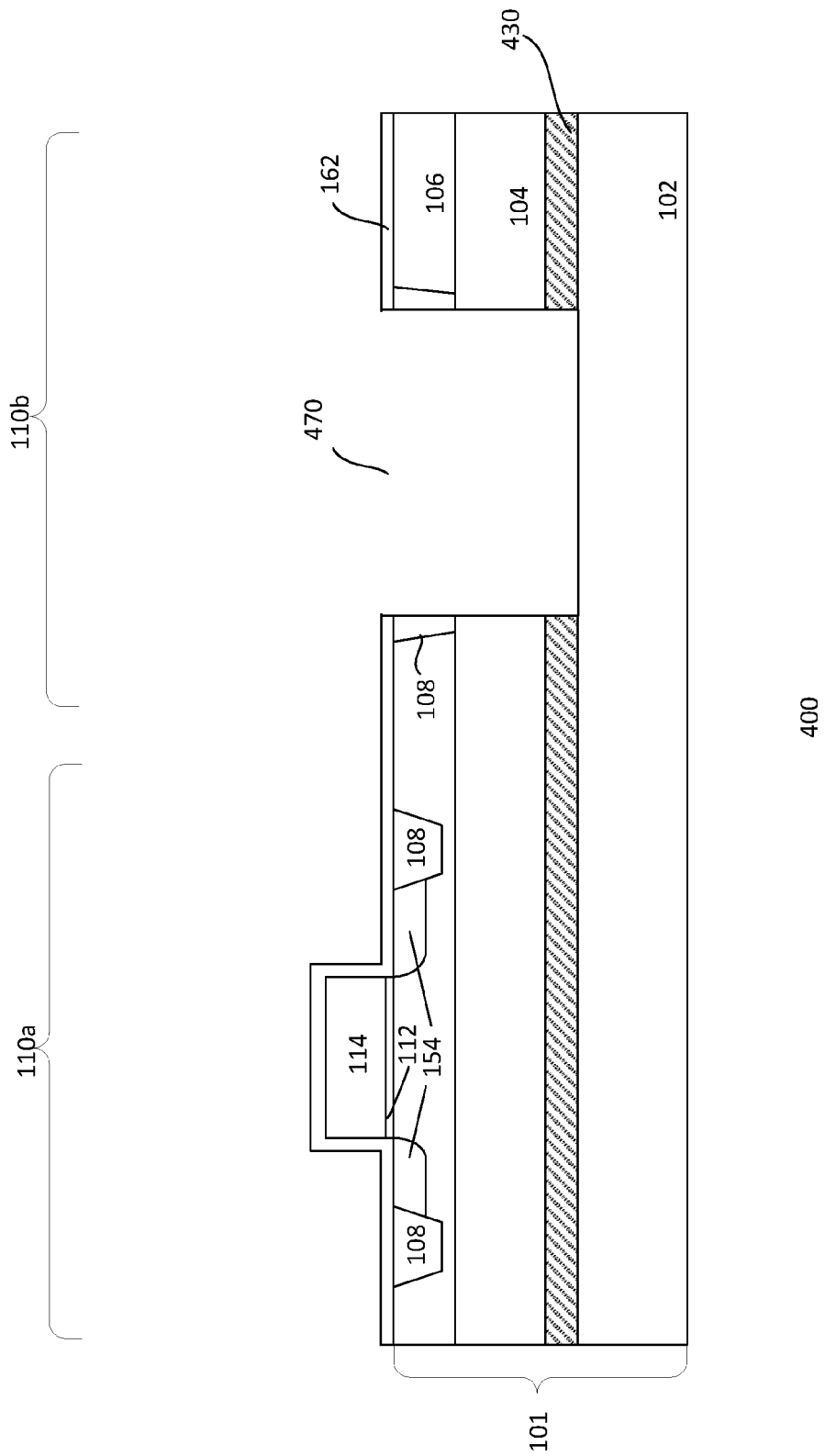

An etch stop layer 162 is formed over the top surface layer 106 and the gate electrode 114 as shown in FIG. 4c. The material and technique for forming the etch stop layer are the same as that described in FIG. 2g. The process 400 continues to define an active area for wide band gap device in the second device region 110b. In one embodiment, a two-step etch process is performed. The first etch process, for example, removes a portion of the isolation region 108 in the second device region and exposes the insulator layer 104 and a portion of the trap rich layer 430. A second etch process is performed to remove the exposed portion of the trap rich layer until top surface of the handle substrate 102 is exposed. As shown, the opening 470 should be sufficiently wide to allow for the formation of wide band gap devices such as HEMT and HBT, but forming other wide band gap devices may also be useful. The remaining portions of the isolation region 108 in the second device region serve to isolate the wide band gap material from the top surface layer 106, thereby preventing electrical shorts. As the isolation region 108 and the insulator layer 104 are formed by the same material, the etching process is simplified.

Figure 4D:
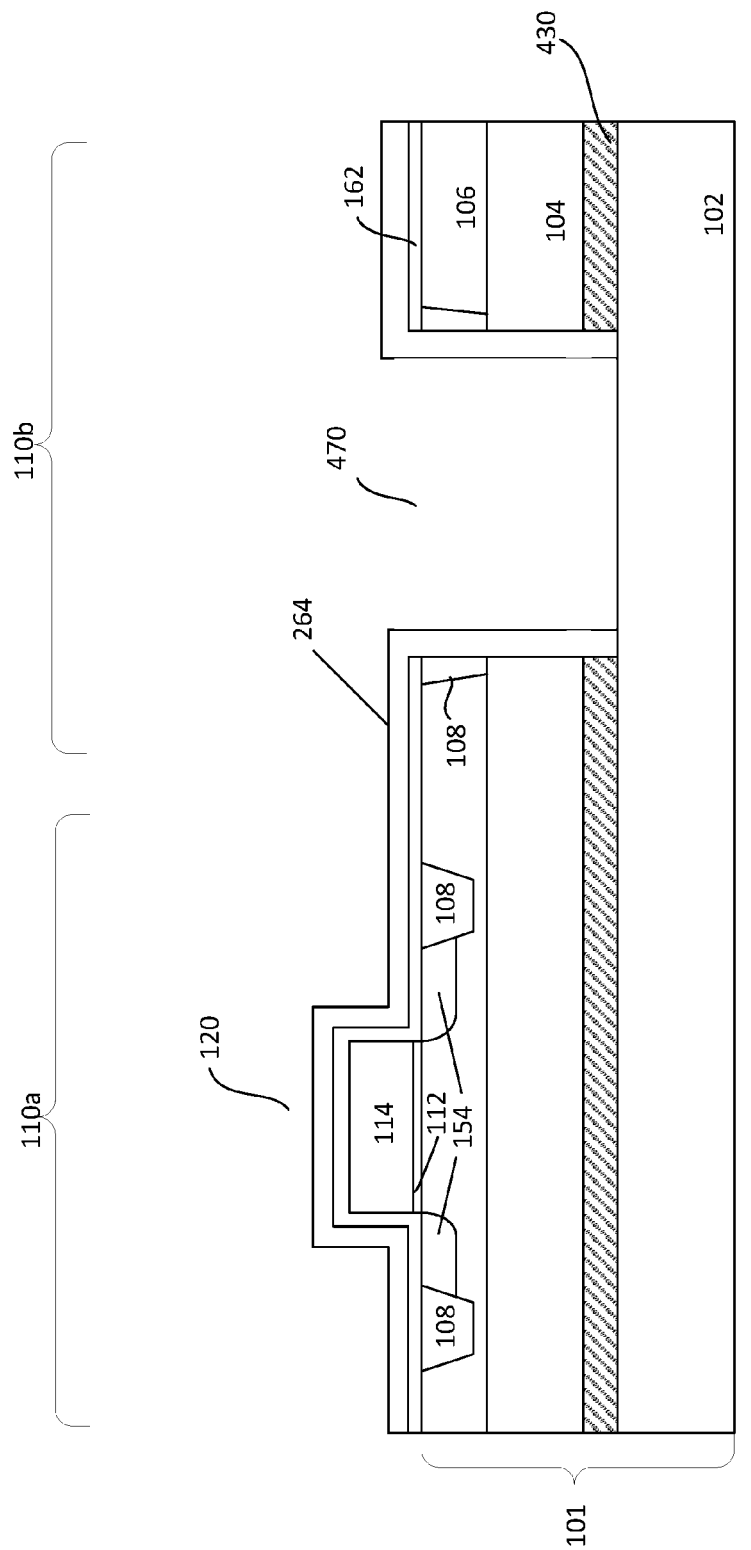

Referring to FIG. 4d, a protective layer 264 is formed on both first and second device regions 110a and 110b. The protective layer, for example, covers the transistor in the first device region and also sidewalls and bottom of the opening 470. The process continues to remove a portion of the protective layer 264 above the handle substrate 102. The materials and techniques for forming the protective layer as well as the removal technique are the same as that described in FIG. 2i. The protective layer 264 protects the device in the first device region during processing of the second device region and remains on the sidewalls of the opening in the second device region 110b.

Figure 4E:
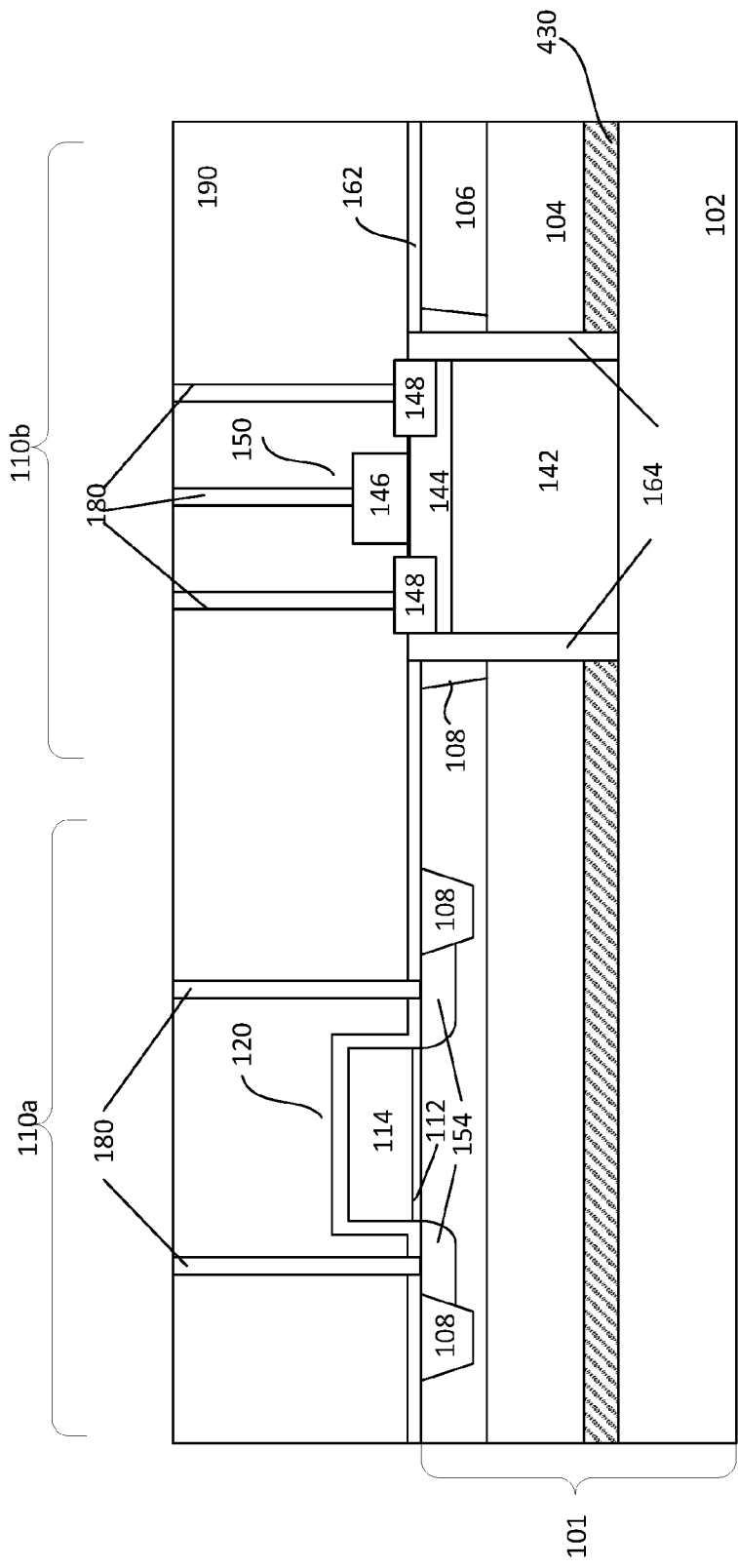

In FIG. 4e, the process 400 continues to form wide band gap device in the second device region 110b. In one embodiment, the process continues to form a HEMT device 150. For example, the process continues with epitaxial growth of buffer layer 142 over the exposed portion of the handle substrate and forming a channel layer 144 over the buffer layer. This is followed by the formation of S/D regions 148 and gate of the HEMT device. Via contacts 180 are formed within the ILD layer 190 and are connected to the S/D regions of both the transistor and HEMT devices. The materials and techniques are the same as that described in FIG. 2k.

Figure 5A:
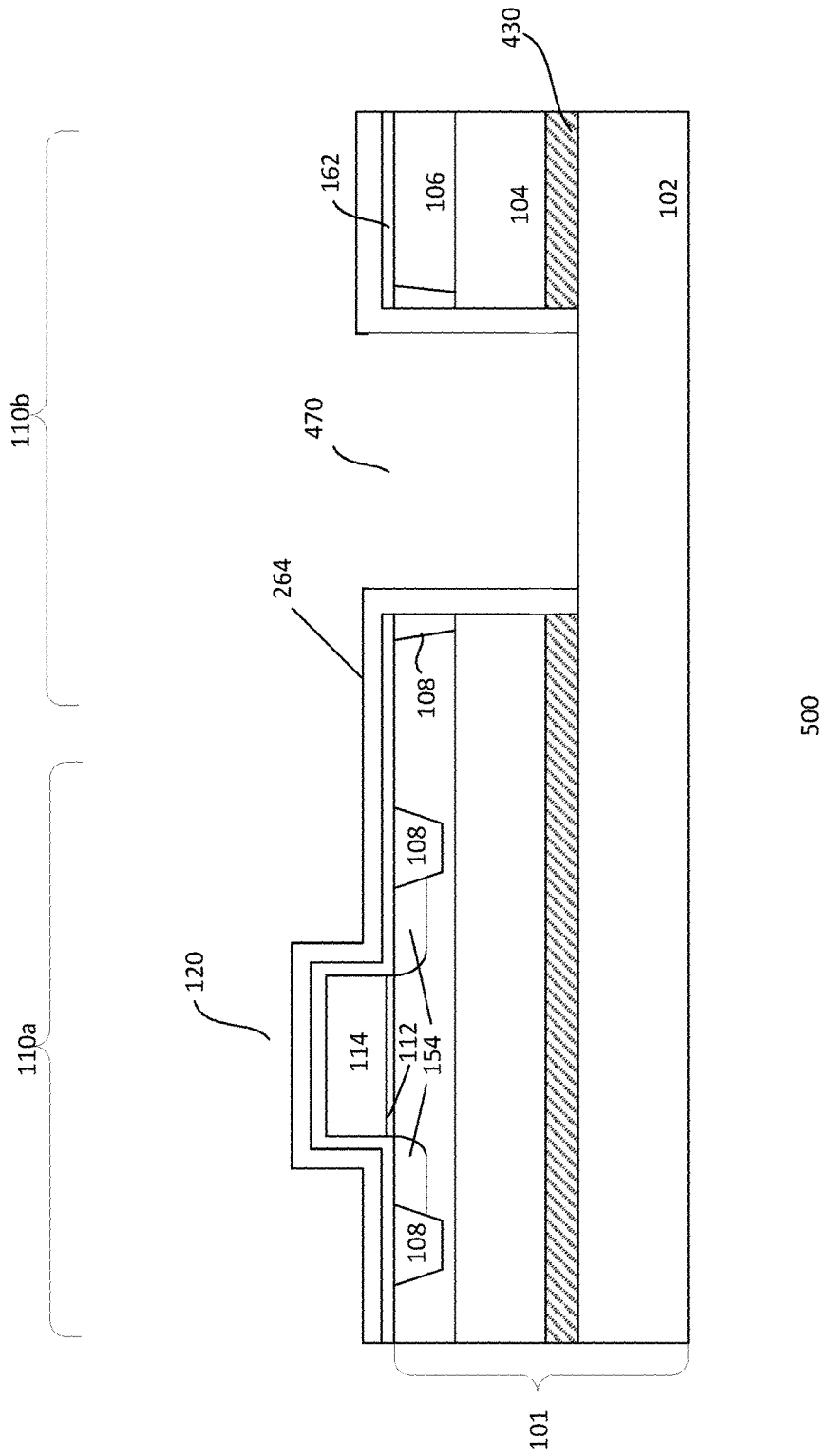
FIGS. 5a-5b show cross sectional views of alternative steps to the alternative embodiment of a process for forming a device.
Figure 5B:
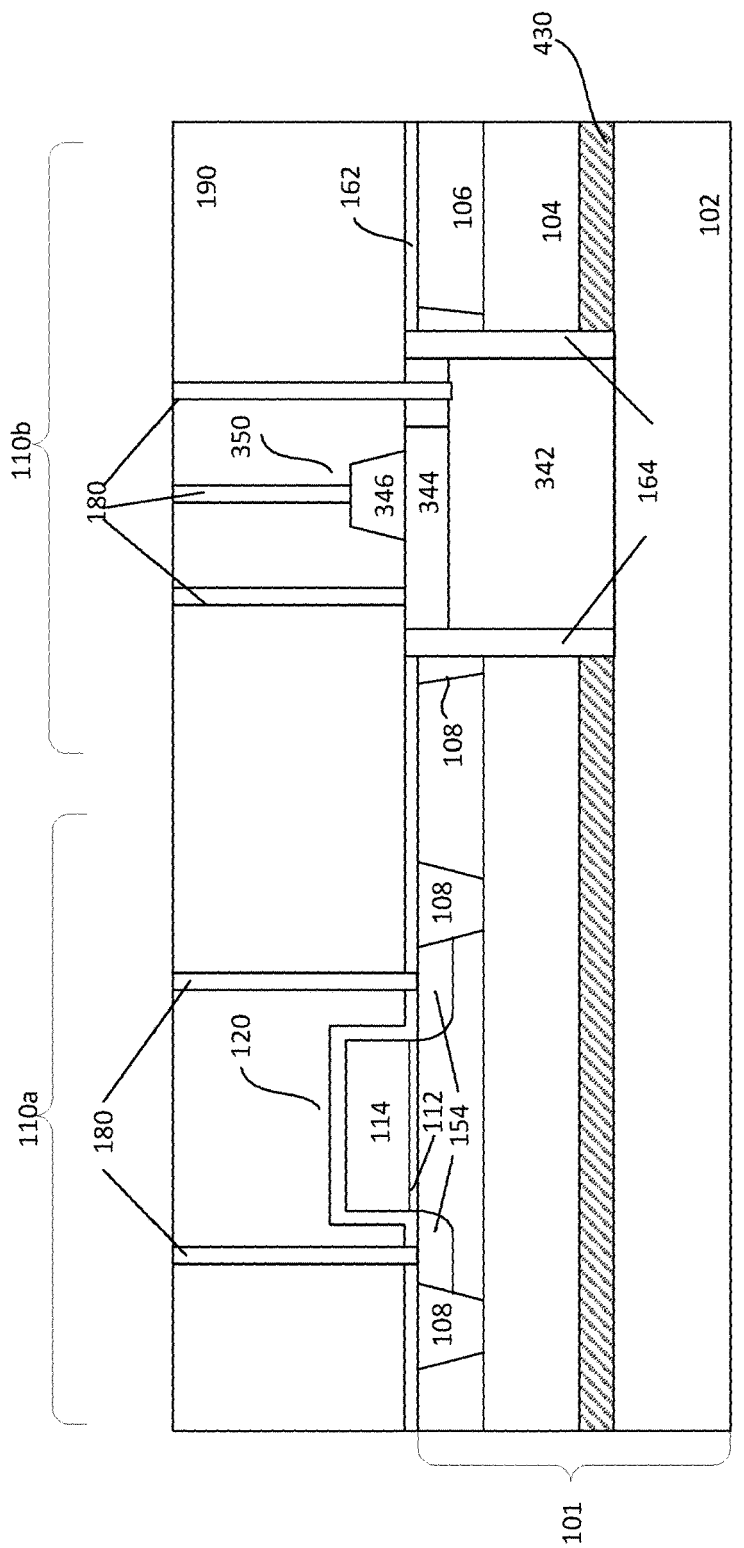

FIGS. 5a-5b show cross-sectional views of alternative steps to the embodiment of a process for forming a device. The device formed by process 500 is the same as that shown in FIG. 1d. As can be seen, FIG. 5a is identical to FIG. 4d. For example, the substrate is processed up to the stage where an opening 470 is formed in the second device region 110b as described in FIG. 4d. However, FIG. 5b differs from FIG. 4e. In the interest of brevity, common elements and features having the same reference numerals may not be described or described in detail. As such, the description of the process in FIG. 5b primarily focuses on the difference(s) between the process shown in FIG. 5b and the process shown in 4e.

Referring to FIG. 5b, the process continues to form a wide band gap device in the second device region 110b. In one embodiment, the wide band gap device is a HBT device 350. For example, for illustration purpose, the process continues with epitaxial growth of active layer 342 over exposed portion of the handle substrate and forming active layer 344 over layer 342. This is followed by the formation and processing of active layer 346 which is formed over layer 344. Via contacts 180 are formed within the ILD layer 190 and are connected to the S/D regions of the transistor in the first device region as well as the base, emitter and collector of the HBT device. The materials and techniques are the same as that described in FIG. 3c.

The embodiments as described result in advantages. For example, the handle substrate includes first crystal orientation (e.g., <111> Si substrate) which is lattice-matched with wide band gap material (e.g., AlGaN) while the top surface layer includes second crystal orientation (e.g., <100> Si substrate) which is suitable for CMOS devices and processing. Thus, the embodiments as proposed assist in integrating monolithically wide band gap devices or modules into RFSOI process in order to form system-on-chip product for RF front end applications.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a support substrate having first crystal orientation;
   a trap rich layer disposed on the support substrate;
   an insulator layer disposed over a top surface of the trap rich layer;
   a top surface layer having second crystal orientation disposed on the insulator layer, wherein the support substrate, the trap rich layer, the insulator layer and the top surface layer correspond to a substrate and the substrate is defined with at least first and second device regions, and wherein the first and second device regions are separated by first isolation regions;
   a transistor disposed in the top surface layer in the first device region; and
   a wide band gap device disposed in the second device region, wherein the wide band gap device in the second device region is formed through a second isolation region in the second device region, and wherein the second isolation region has a greater width than the first isolation regions.

2. The device of claim 1 wherein the support substrate comprises a <111> oriented single crystal substrate and the top surface layer comprises a <100> oriented single crystal substrate.

3. The device of claim 1 wherein the trap rich layer comprises nano-crystal Si or wide band gap materials which comprise GaN, AlGaN, GaAs or SiC.

4. The device of claim 1 wherein the first isolation regions extend to a top surface of the insulator layer.

5. The device of claim 1 wherein the wide band gap device is isolated from the top surface layer by a portion of the second isolation region in the second device region.

6. The device of claim 1 wherein the second isolation region and the insulator layer are formed by the same material.

7. The device of claim 1 further comprising a nitride layer over the top surface layer in the first and second device regions.

8. The device of claim 7 wherein the nitride layer covers the transistor in the first device region.

9. The device of claim 1 wherein the wide band gap device in the second device region comprises a gate and S/D regions.

10. The device of claim 9 further comprising a dielectric layer, contact plugs are disposed in the dielectric layer, the contact plugs extend to the gate and the S/D regions of the wide band gap device.

11. The device of claim 1 further comprising an opening to expose the insulator layer and a portion of trap rich layer in the second device region.

12. The device of claim 11 further comprising a protective layer disposed in the second device region, wherein the protective layer covers sidewalls of the opening.

13. The device of claim 1 wherein the wide band gap device in the second device region comprises a High Electron Mobility Transistor (HEMT) or Hetero-junction Bipolar Transistor (HBT) device, wherein the HEMT or HBT device comprises an emitter and active layers.

14. A device comprising:
a support substrate having first crystal orientation;
a trap rich layer disposed on the support substrate;
an insulator layer disposed over a top surface of the trap rich layer;
a top surface layer having second crystal orientation disposed on the insulator layer, wherein the support substrate, the trap rich layer, the insulator layer and the top surface layer correspond to a substrate and the substrate is defined with at least first and second device regions, and wherein the first and second device regions are separated by first isolation regions;
a transistor disposed in the top surface layer in the first device region;
a wide band gap device disposed in the second device region, wherein the wide band gap device in the second device region is formed through a second isolation region in the second device region; and
an opening to expose the insulator layer and a portion of trap rich layer in the second device region.

15. The device of claim 14 further comprising a protective layer disposed in the second device region, wherein the protective layer covers sidewalls of the opening.

16. The device of claim 15 wherein the protective layer extends from a top surface of the top surface layer towards a top surface of the support substrate.

17. The device of claim 15 wherein the protective layer extends from a top surface of the top surface layer towards a top surface of the trap rich layer.

18. The device of claim 14 wherein the wide band gap device in the second device region comprises a High Electron Mobility Transistor (HEMT) or Hetero-junction Bipolar Transistor (HBT) device, wherein the HEMT or HBT device comprises an emitter and active layers.

19. The device of claim 18 further comprising a dielectric layer, contact plugs are disposed in the dielectric layer, the contact plugs extend to the emitter and the active layers of the HEMT or HBT device.

20. The device of claim 14 wherein the second isolation region has a greater width than the first isolation regions.

* * * * *